(12) United States Patent
Batty et al.

(10) Patent No.: US 10,384,318 B1
(45) Date of Patent: Aug. 20, 2019

(54) THERMAL-CONTROL, TRUSS-PLATE APPARATUS AND METHOD

(71) Applicant: Thermal Management Technologies, North Logan, UT (US)

(72) Inventors: J. Clair Batty, North Logan, UT (US); Blake Rusch, Hyde Park, UT (US); Scott Schick, Hyde Park, UT (US)

(73) Assignee: Thermal Management Technologies, North Logan, UT (US)

( * ) Notice: Subject to any disclaimer, the term of this patent is extended or adjusted under 35 U.S.C. 154(b) by 615 days.

(21) Appl. No.: 14/756,800

(22) Filed: Oct. 5, 2015

Related U.S. Application Data

(60) Division of application No. 13/507,593, filed on Jul. 12, 2012, now Pat. No. 9,149,896, which is a
(Continued)

(51) Int. Cl.
*B23P 15/26* (2006.01)
*F28D 15/02* (2006.01)
(Continued)

(52) U.S. Cl.
CPC .......... *B23P 15/26* (2013.01); *F28D 15/0233* (2013.01); *F28D 15/0275* (2013.01);
(Continued)

(58) Field of Classification Search
CPC ............ F28D 15/0275; F28D 15/0283; F28D 1/05391; F28D 15/0233; F28D 15/04; F28D 15/046; H05K 7/20636; B23P 15/26
See application file for complete search history.

(56) References Cited

U.S. PATENT DOCUMENTS 3,490,718 A * 1/1970 Vary .................. B64G 1/50
 165/104.25
4,789,026 A * 12/1988 Shank ................ F28D 15/046
 165/104.26
(Continued)

FOREIGN PATENT DOCUMENTS

CA 2272260 5/1998
EP 0687627 B1 8/2000
(Continued)

OTHER PUBLICATIONS

U.S. Appl. No. 12/598,548, filed Sep. 23, 2010, Wadley, Haydn N.G.
(Continued)

*Primary Examiner* — Keith M Raymond
*Assistant Examiner* — Nael N Babaa
(74) *Attorney, Agent, or Firm* — Pate Baird, PLLC

(57) ABSTRACT

Modular thermal truss plates carry heat in multiple directions. Framing around an array of flat heat pipes provides mechanical and thermal connections to other truss plates, and a base, such as a satellite, thereby supporting thermally active equipment. Walls sandwich banks of flat heat pipes and may bond to a honey comb, metal core conducting heat between multiple walls. Each bank of flat heat pipes passes heat best in one direction, and may be formed of corrugated copper sheets spaced apart by a metal mesh, such as an expanded metal or screen, also stamped or otherwise formed into a corrugated configuration. Joining methods (e.g., brazing, soldering, etc.) increase stiffness, pressure containment, and strength, by binding the two layers of metal sheet to one another.

11 Claims, 20 Drawing Sheets

Related U.S. Application Data continuation of application No. 13/468,335, filed on May 10, 2012.

(60) Provisional application No. 61/484,888, filed on May 11, 2011.

(51) Int. Cl.
*F28D 15/04* (2006.01)
*F28D 1/053* (2006.01)
*H05K 7/20* (2006.01)

(52) U.S. Cl.
CPC ......... *F28D 15/0283* (2013.01); *F28D 15/04* (2013.01); *F28D 15/046* (2013.01); *F28D 1/05391* (2013.01); *H05K 7/20636* (2013.01)

(56) References Cited

U.S. PATENT DOCUMENTS

| | | | |
|---|---|---|---|
| 5,205,037 A | 4/1993 | Kuriki | |
| 6,158,507 A | 12/2000 | Rouse et al. | |
| 6,167,948 B1 | 1/2001 | Thomas | |
| 2001/0004934 A1* | 6/2001 | Yamamoto | F28D 15/0233 165/104.11 |
| 2008/0236792 A1 | 10/2008 | Mast et al. | |
| 2009/0019695 A1 | 1/2009 | Zobel et al. | |
| 2009/0321053 A1* | 12/2009 | Tegrotenhuis | F25B 37/00 165/104.26 |
| 2010/0089546 A1 | 4/2010 | Perez et al. | |
| 2010/0315781 A1* | 12/2010 | Agostini | F28D 15/0233 361/700 |

FOREIGN PATENT DOCUMENTS

| | | | |
|---|---|---|---|
| EP | 0780295 B1 | 10/2002 | |
| EP | 1265825 A2 | 12/2002 | |
| EP | 1017649 A1 | 6/2004 | |
| EP | 1405790 B1 | 5/2006 | |
| WO | WO2006/073269 A1 | 7/2006 | |

OTHER PUBLICATIONS

M. Gao and Y. Cao, "Flat and U-Shaped Heat Spreaders for High-Power Electronics "Heat Transfer Engineering, 2003, vol. 24 No. 3.

David H. Altman, Justin Weibel, Suresh V. Garimella, and Mark North, "Thermal Ground Plane Vapor Chamber Heat Spreaders for High Power and Packaging Density Electronic Systems," Electronics Cooling, Mar. 14, 2012.

Reay, David, Kew, Peter, "Heat Pipes Theory, Design, and Applications," Butterworth-Heinemann, Burlington, MA, 2006, p. 123-128.

M. R. Maschmann and H. B. Ma, "An Investigation of Capillary Flow Effect on Condensation HeatTransfer on a Grooved Plate," Heat Transfer Engineering, vol. 27 No. 3 2006.

Peter Stephan and Christoph Brandt, "Advanced Capillary Structures for High Performance Heat Pipes," Heat Transfer Engineering, vol. 25 No. 3 2004.

Y. Cao and M. Gao, "Wickless Network Heat Pipes for High Heat Flux Spreading Applications," International Journal of Heat and Mass Transfer, 45 (2002) 2539-2547.

Faghri, Amir, Heat Pipe Science and Technology, Taylor and Francis, Washington, DC, 1985 pp. 19-32, 241-246.

Gillmore, David G., Spacecraft Thermal Control Handbook, The Aerospace Press, ElSegundo, CA, 2002 pp. 489-492, 496-502.

Peterson, G.P., An Introduction to Heat Pipes Modeling, Testing, and Applications, John Wiley & Sons, Inc., Hoboken, NJ, 1994 pp. 241-246.

Thermacore, http://www.thermacore.com/products/vanor-chamber-assembly-heat-spreaders.aspx, Apr. 8, 2013.

* cited by examiner

THERMAL-CONTROL, TRUSS-PLATE APPARATUS AND METHOD

RELATED CASES

This application: is a divisional (continuation) of co-pending U.S. patent application Ser. No. 13/507,593, filed Jul. 12, 2012, which is a continuation of abandoned U.S. patent application Ser. No. 13/468,335, filed May 10, 2012, which claims the benefit of U.S. Provisional Patent Application Ser. No. 61/484,888, filed May 11, 2011, all of which are incorporated herein by reference.

RIGHTS OF U.S. GOVERNMENT

The invention was made with Government support under Contract FA9453-10-C-0053 awarded by the United States Air Force. The Government has certain rights in the invention.

BACKGROUND

The Field of the Invention

This invention relates to heat transfer and, more particularly, to novel systems and methods for heat transfer through flat heat pipes covering large areas with respect to their length.

The Background Art

Heat transfer is the mechanism by which refrigeration systems maintain a cool region within a hotter region. Heat transfer is also the mechanism by which energy is carried from points of generation such as furnaces and the like to areas to be heated, such as materials, space heating, or the like. Heat transfer is driven by a difference in temperature between a material at a comparatively higher temperature driving energy to a material (e.g., location or object) at a lower temperature to receive that energy. In all cases of heat transfer, the temperature difference between the high temperature region or object and the lower temperature region or object is a driving potential for the transfer of heat, whether linear or non-linear in effect.

Typically, heat transfer deals with the resistance to heat transfer through various materials, spaces, and so forth. The study of radiation, conduction, and convection seeks to identify the controlling parameters that govern the relationship between the temperature differences, heat transferred, material properties, distances, areas, and the like. Thus, in general, it is desirable to minimize the thermal resistance in order to maximize heat transfer from a region of higher temperature to a region of lower temperature. Similarly thermal resistance is to be maximized in order to minimize heat transfer. To the extent that thermal resistance is reduced, more heat may be transferred with a comparatively lesser temperature difference.

Electrical equipment has always required consideration of heat transfer to remove the heat generated by electrical resistance losses. Likewise, in systems such as satellites, spacecraft, and the like, the importance of maintaining low temperatures in certain equipment, such as sensors creating or recording images, and the like may require unique combinations of temperatures and thermal resistance.

Meanwhile, mechanical connections and distances required to remove heat may be substantial. Moreover, structural requirements for mechanical support may be substantial, requiring support against the 'g-forces' or acceleration forces of launch and other movements. In fact, heat transfer and mechanical support are often at odds, wherein what is good for one is poor for the other. The result is tradeoffs that poorly serve one or both.

Finally, space is not without traffic of particles and various objects, within a broad range of sizes, from dust to satellite to asteroid sizes. These may be either naturally occurring or man-made. Space junk, small meteoric objects, and other projectiles may penetrate a surface of a satellite, permanently disabling mechanical, fluid, electrical, and other systems contained therein.

Thus, it would be an advance in the art to develop a more effective heat transfer system, particularly one that would be adaptable to satellite use, having much lower weight than earthbound and previous satellite systems. It would be an advance to provide reduced thermal resistance, permitting temperature differentials less than are presently known in the art of satellite, and even less than those of many earthbound systems.

It would be a further advance in the art to create a comparatively strong structural support system, compared to prior art systems of equivalent weight in satellites and earthbound systems. It would be a further advance if such as system would support robust heat transfer, having comparatively better heat flux per degree of temperature differential than prior art satellite systems of comparable weight.

It would be a yet further advance to provide redundancy against failure in cases of mechanical damage, such as penetration by space debris or other objects. This could be significantly more valuable than earthbound systems, where such protection is not required at comparable weights to those of satellites.

SUMMARY OF THE INVENTION

In view of the foregoing, in accordance with the invention as embodied and broadly described herein, a method and apparatus are disclosed in one embodiment of the present invention as including modular thermal truss plates that may be configured to carry heat in multiple directions. Meanwhile, a combination of framing around a central lay up of such a plate or panel may provide mechanical or thermal connections to other plates, and to a structure, such as a satellite frame, needing to support thermally active equipment such as electrical equipment.

In certain embodiments, walls, formed of skins (either composite layers or metal) sandwiching a flat thermal heat pipe or several flat thermal heat pipes therein may be combined by bonding them to a honey comb, metal core. The core conducts heat between multiple walls. Each of the walls, being a sandwich of an external skin layer on each side of a bed or bank of flat heat pipes capable of passing heat excellently in one direction.

By placing each of the walls in a bonded relationship sandwiching the thermal core, such that each of the walls has a preferential heat transfer direction orthogonal to the other, heat may be transferred in three dimensions. Heat may transfer in and out of a wall. Heat may pass along the heat pipes of one wall. Heat may pass through the conducting core to the opposite wall. Heat may then be conducted in a preferential direction orthogonal to that of the first wall.

By providing multiple flat heat pipes in each wall, and by providing opposite walls having preferential heat transfer directions orthogonal to one another, the apparatus or truss plate may be particularly robust and resistant to single point failures. It may function, although at a limited performance if one of the heat pipes fails or is damaged. In certain embodiments, the truss plate-heat pipes may be connectable to one another to create larger expanses. Thermally conductive framing materials may provide excellent thermal conduction between adjacent truss plates.

Each truss plate-heat pipe may be formed of corrugated copper sheet spaced from an opposite piece of corrugated copper sheet by a mesh, such as an expanded metal or screen material that is stamped or otherwise formed into a corrugated screen. Thus, the corrugated screen or mesh spaces apart the corrugated metallic (e.g. copper), or possibly polymeric, corrugated sheets. Meanwhile, appropriate joining methods (e.g., brazing, soldering, etc.) may bond corrugated mesh material to corrugated sheets in order to form a truss panel that has substantially increased stiffness and strength. The mesh binds the two layers of metal sheet to one another to support higher internal pressures. Thus, dimensional stability results, providing for pressure and temperature variations. Meanwhile discreet spaces exist for the traveling of a working fluid liquid phase, such as water or other liquid therealong. In a direction opposite travels a vapor phase of the working fluid through adjacent vapor spaces.

Typically, the vapor spaces are comparatively larger, and are located in the center between the trussed pair of adjacent copper or other metal sheets. Meanwhile, the mesh material also serves to support capillary action within the corrugations of the metal sheets. Also, larger spaces provided by the corrugated mesh provide vapor spaces between the metal sheets to pass vapor phase operating fluid in a direction opposite that of the motion of capillary action of the liquid phase of the operating fluid.

Some of the benefits of apparatus and methods in accordance with the invention include higher pressures for operation of the flat truss plate-heat pipe.

Because the individual walls or panels are compartmentalized, they are less vulnerable to damage or individual failure and may be positioned with clearances therebetween to support hardware connections by fasteners penetrating through the lay up of the thermal strips.

Improved manufacturability results from the use of materials that can be readily manufactured for the sheets, the mesh, the closure portions forming the walls between the sheets, and so forth.

Testing by modeling has been done for heat transfer rates across a thermal control panel formed of multiple truss plate-heat pipes in a first thermal control panel, bonded to a honey comb core, to another thermal control panel, in order to transfer heat across a sandwich thermal control panel. Heat transfer has been analyzed from one edge of a sandwich thermal control panel through to an opposite edge of the same panel and from within the panel to an adjacent edge. In both cases, temperature differences, and therefore effective thermal conductivity through the truss plates has shown to be very favorable.

By forming the truss plate heat pipe in banks, embedding each bank in a thermal control panel, and then bonding those panels together through a lightweight metal core, improved pressure support, frequency response to vibration, temperature limits across the panels, tolerance to failure, static load support, proof pressure, burst pressure, and vacuum support against leakage, have all shown to be very favorable for extremely demanding applications.

It has been determined that outgassing within the truss plate heat pipe may be minimized to meet very stringent requirements, in accordance with the invention. Cleaning, design life, mechanical and thermal interfaces, and mass totals appear to be within a reasonable range. The electrical connection and grounding requirements appear to be easily tractable.

Edge connection temperature differentials between sandwich thermal control panels adjacent to one another on or within a structure have shown to be well within operational values for many applications in terrestrial and space applications. Moreover the conducting frames in which the truss plates are mounted may also be readily conducting to assure heat transfer to and from the panels.

Meanwhile, structural stiffness of the sandwich thermal control panel is substantial Due to the stiff thermal control panels bonded to the control honey comb structure. Clearances at the intersections of the truss plate heat pipes provide locations for penetrations through each panel in order to mount hardware there against. Thus, mechanical support as well as thermal support are provided in a single panel for mounted hardware.

Current thermal computer models, using the dimensions and properties of the materials of the panels, demonstrate that temperature differentials across one truss plate may be as little as 4.5 degrees kelvin, and less than 3.5 degrees on a mounting surface given a 56 W heat load. Similarly, the temperature drop between adjacent, interconnected panels has been demonstrated to be less than 2.5 degrees kelvin for the same heat loading.

In some embodiments, truss plate heat pipes in accordance with the invention may operate across a range from about −40 degrees Celsius to about 75 degrees Celsius and above with a single working fluid, and a single structural design. Accordingly, the specific thermal conductivity of a truss plate in accordance with the invention appears to be on the order of greater than 1 watt per meter degree kelvin per kilogram per cubic meter, with a specific stiffness on the order of greater than 13 mega Pascals per kilogram per cubic meter. This compares very favorably to other conventional materials, including aluminum, beryllium, copper, and the like. Thus, the specific thermal conductivity is better than that of pure metals, of comparable specific stiffness.

In certain presently contemplated embodiments, a composite, or metal material at the outermost surface of each wall may be on the order of 30 thousandths of an inch, with copper corrugated to have a total thickness on the order of 66 thousandths. The vapor space typically takes about 100 thousandths. Thus, the total wall thickness is on the order of 232 thousandths. A 0.5 inch thickness of honey comb core is oriented to conduct heat along the lengths of the honey comb cavities between a pair of walls. The honey comb core is bonded by a thin layer of partially cured or B-stage polymer such as a B-stage epoxy positioned between the innermost surface of one wall and the honey comb core. Likewise on the opposite side of the honey comb core a thin layer, on the order of about 5 thousandths thickness, bonds the honey comb core to the opposite wall.

As a means to maintain the structural and thermal performance of each thermal truss heat pipe, the corrugations on the outside thereof (e.g., the face thereof that contacts the composite skin on the respective wall) may be filled with a suitable polymer. It has been found that a polymeric material may be smeared in and screeded off to fill the furrows or grooves in the outside surface of the corrugated metal sheet.

In one embodiment, 110 copper is used in 3.35 inch widths and corrugated to sandwich within two such sheets a quantity of copper mesh. The overall thickness of the thermal strip formed of the copper spaced apart by copper mesh is typically on the order of 0.170 inch total thickness. These chambers or thermal strips may be formed in lengths suitable for extending across a particular truss plate. In one configuration, 20.8 inch lengths are suitable for the longer modules. A 12.5 inch length is suitable for those near the edges, which must provide clearance for openings handling cables and other lines that must pass through the panel.

The sandwich thermal control panels each include two walls, each wall having two skins. Between each pair of skins being a truss plate heat pipe, or rather several truss plate heat pipes laid out side by side. Each of those truss plate heat pipes, since it is corrugated, relies on an end wall or end rail fitted to the corrugated shape and brazed to seal the end of the truss plate heat pipe.

Likewise, side walls or side rails fit into the outermost or near by corrugation of each metal sheet in order to be brazed or otherwise bonded to seal the side edges or lateral edges of each of the thermal strips. An aperture in the end wall or end rail receives a tube that may be brazed thereinto in order to act as a vacuum port for evacuating and filling each of the truss plate heat pipes after fabrication.

In order to provide improved dimensional stability, truss plate heat pipe modules are provided along with spacer material on the outer skin. This provides spacing in the region between adjacent truss plate heat pipes, and in regions of the panel extending outside of the truss plate heat pipes, such as at the corners of the lay up that will form each wall of the thermal control panel.

The skins may be formed of a prepreg fabric, such as a 140 GSM plain weave carbon fabric. One suitable material is the M55J material from Toray. This has a strength over 580 KSI and a modulus of elasticity of about 78 MSI. The skins may also be metallic. Framing for the truss plate may be made using aluminum extrusions or castings such as may be fabricated from 6061 aluminum or other thermally conductive metallic material. These may be formed to mate with the lay up of two walls bonded to a core. The intimate contact for thermal and mechanical purposes provides a structurally sound and thermally effective sandwich thermal control panel.

In certain embodiments, the truss plate may be provided with fasteners formed through the lay up, thus penetrating both walls and the intermediate core. Typically, the spacing there between is on the order of 10 cm in order to accommodate the width of each thermal strip. Meanwhile, in the orthogonal direction, the spacing may be about 5 cm or other suitable dimension. Accordingly, fasteners, such as bonded rivets, bolts, screws, or the like may be used to connect devices to the thermal control panel.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

DETAILED DESCRIPTION OF THE PREFERRED EMBODIMENTS

Figure 1:
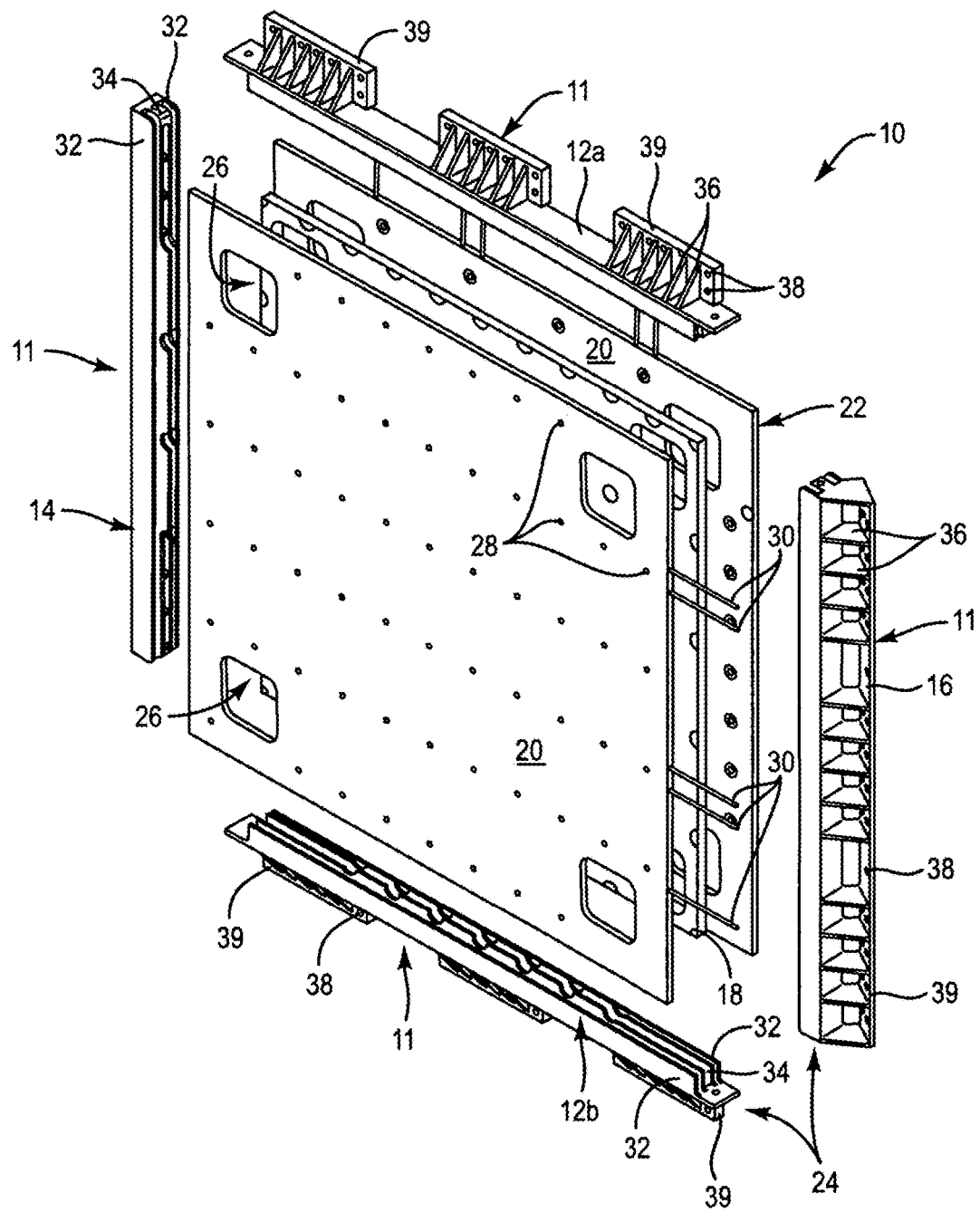
FIG. 1 is a perspective exploded view of one embodiment of a sandwich thermal control panel in accordance with the invention.

It will be readily understood that the components of the present invention, as generally described and illustrated in the drawings herein, could be arranged and designed in a wide variety of different configurations. Thus, the following more detailed description of the embodiments of the system and method of the present invention, as represented in the drawings, is not intended to limit the scope of the invention, but is merely representative of various embodiments of the invention. The illustrated embodiments of the invention will be best understood by reference to the drawings, wherein like parts are designated by like numerals throughout.

The basis of the invention is the truss plate heat pipe, 10. This unit provides the primary means for spreading heat. The internal mesh truss structure rails, and end fittings, 9, 10, 11, 12 combine to make the structurally and thermally capable truss plate heat pipe. In one presently contemplated embodiment, an apparatus 10 may include rails 11 such as a top rail 12a, bottom rail 12b, a joining rail 14 and an opposite joining rail 16. In general, these may all be referred to as rails 11, or may be referred to individually in their specific roles as rails 12a, 12b, 14, 16.

Referring to FIG. 1, while referring generally to FIGS. 1-24, an apparatus and method in accordance with the invention may include a survivable, modular, combined thermal truss plate 10, also referred to as an apparatus 10.

In one currently contemplated embodiment, a thermal control panel 17 or apparatus 17 formed to be survivable, modular, and combined thermal and mechanical in nature and function, may rely on a small core 5. Typically, in one presently contemplated embodiment, the core 5 is formed of a honey comb shaped material formed by bonding sheets of aluminum to one another and then drawing them apart to form the honey comb structure.

Typically, a layer of bonding material, such as a B-staged epoxy material, thermoplastic, thermoset plastic, or the like may be spread on one side of a skin 17. The core 5 may then be bonded to the skin 17. Opposite the first thermal control panel 19, 20 a second wall may be bonded likewise to the core 18. Together, the two skins and their intervening small core 5 form a lay up 5. The lay up is the internal portion of the truss plate 10.

The external portion, or the edge portion, of the sandwich thermal control panel 2 is a frame 24. The frame 24 is formed of the various rails 11, and specifically a top rail 12a, bottom rail 12b, edge rail 14, and another edge rail 16 opposite the first edge rail. These rails 11 are fastened together and to the lay up 22 to form a frame 24 around the lay up 22. The rails 11 may be attached by fasteners to one another to form the frame 24.

Thus, the frame 24 with its contained lay up 22 provides thermal heat transfer properties and mechanical stiffness and strength properties suitable for the combined functions of thermal management and mechanical support. For example, strength, distortion, displacement, vibration frequency response, and the like may all be controlled by the combination of the truss plate heat pipe lay up 22 and frame 24 forming the sandwich thermal control panel 10.

Each sandwich thermal control panel 10 may be provided with apertures 26 for passing wires, cables, material transport lines, tubes, and so forth through the truss plate 10. Thus, devices operating exterior or on either side face of the sandwich thermal control panel 10 may exchange data, electric power, fluids, or the like with other devices or components on the opposite side of the sandwich thermal control panel 10. Thus, the apertures 26 may be referred to as access apertures 26 for lines and other service members to pass through.

One of the functions of a sandwich thermal control panel 10 is to support devices structurally. Accordingly, an array of holes 28 may penetrate through an individual wall 20, or even through the entire lay up 22. Fasteners such as screws, bolts, rivets, bonded rivets, or the like may penetrate through the mounting apertures 28, or simple apertures 28, in order to fasten any device or component to the lay up 22. Thus, the sandwich thermal control panel 10 performs as a structural mounting substrate for devices connected at the apertures 28.

The thermal control panels 20 contain other components performing two-phase fluid heat and mass transport processes. Accordingly, the interiors must be evacuated through tubes 30. Typically, the tubes 30 are metallic and brazed to metallic internal components of the lay up 22, and specifically inside the walls 20. The tubes may extend out through the frame 24 in order to provide access for evacuation. After evacuation, followed by refilling with a two-phase working fluid, the tubes 30 may be crimped and cut off in a single cold-welding, crimping process.

Meanwhile, each of the rails 11 may be provided with an outer flange 32 on each side thereof. The flanges 32 are positioned to capture the thermal control panels 20 therebetween. Likewise, a spacer 34, which may also operate as a flange 32, is sized to fit between adjacent thermal control panels 20 of a single sandwich thermal control panel 10. Thus, the distance between each flange 32 and adjacent spacer 24 is sized to receive and bond therein a thermal control panel 20 of the lay up 22.

In certain embodiments, it may be structurally advantageous to form gussets 36 at certain locations on each rail 11. Gussets 26 provide structural strength and improved section modulus in order to support fastening of the frame 24 to an underlying structure, such as a satellite, a frame, an electrical box, or the like, as well as serving to connect various rails 11 to one another in adjacent sandwich thermal control panel 10. For example, in the illustrated embodiments, gussets 36 may be formed between orthogonal, plate-like ears 39 or attachment extensions 39 of each rail 11.

Figure 2:
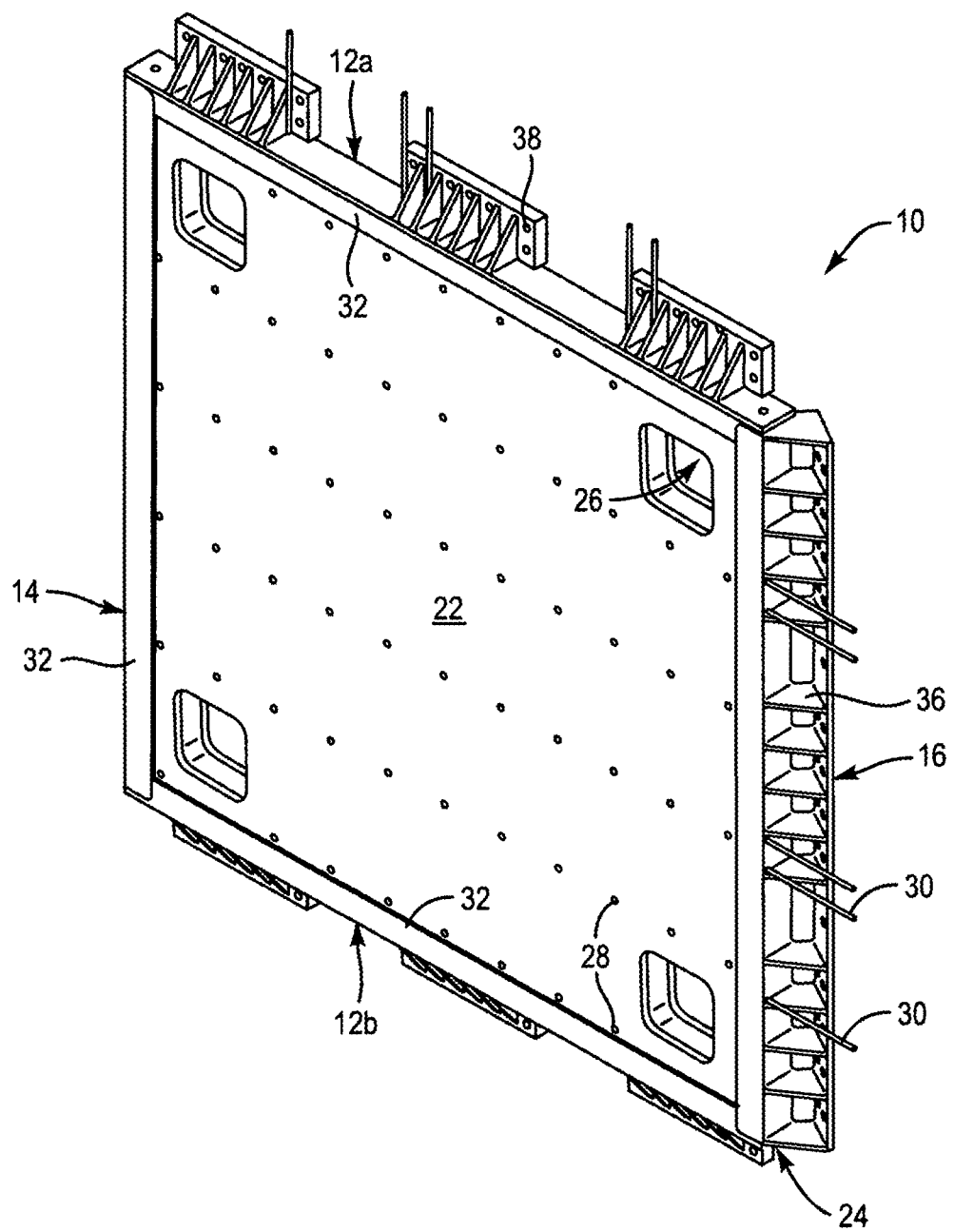
FIG. 2 is the perspective view of the assembled apparatus of FIG. 1.
Figure 3:
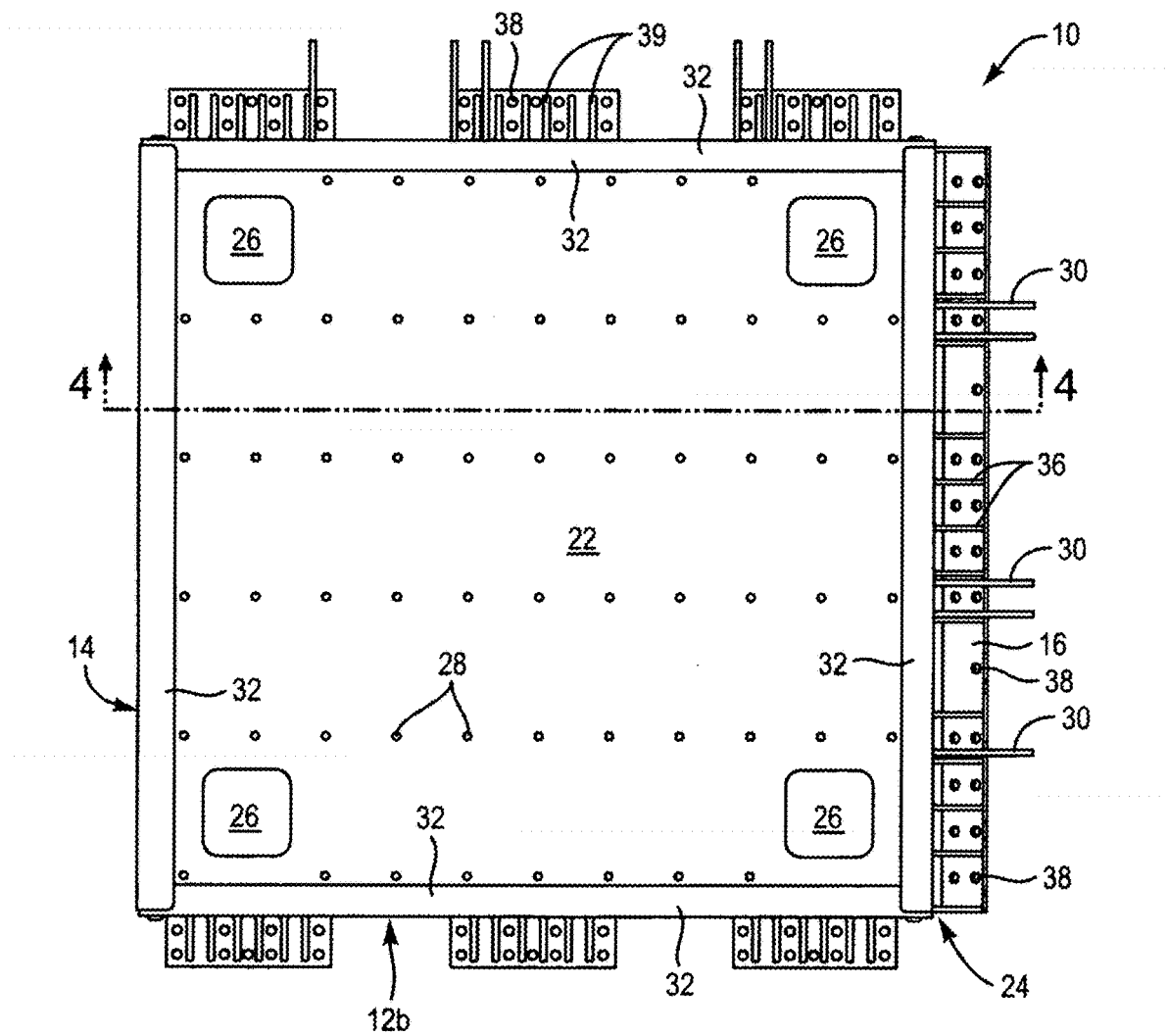
FIG. 3 is a top plan view thereof, the thermal control panel being in a horizontal orientation.

The apertures 38 formed in a particular rail 11, such as the rails 12, 14, 16 may receive fasteners to mount the sandwich thermal control panel to another device or to another sandwich thermal control panel 10. These apertures 38 may result in fasteners secured therein applying forces to the rails 11. Resisting those forces requires increased section modulus, depending on the values of those forces, and thus the gussets 36 may maintain the "ear portions" 39 in fixed and rigid relation with respect to one another. Referring to FIGS. 1-3, one may contemplate the thermal and modular character of a sandwich thermal control panel 10. In one manner of speaking, the sandwich thermal control panel 10 is formed as a sandwich structure having two thermal control panels 20 spaced apart by a honey comb core 18, thus improving the section modulus thereof against bending moments. On the other hand, the sandwich thermal control panel 10 also has additional structure inside each thermal control panel 20. That is, each thermal control panel 20 has a truss plate heat pipe for transferring heat. Polymers are not the best heat transfer media. Metals are typically superior to most polymers. However, combined convection processes and conduction processes together here can improve even polymers over conductivity of heat through solid metals such as aluminum and copper, which have comparatively higher thermal conductivities than many other structural metals.

Figure 4:
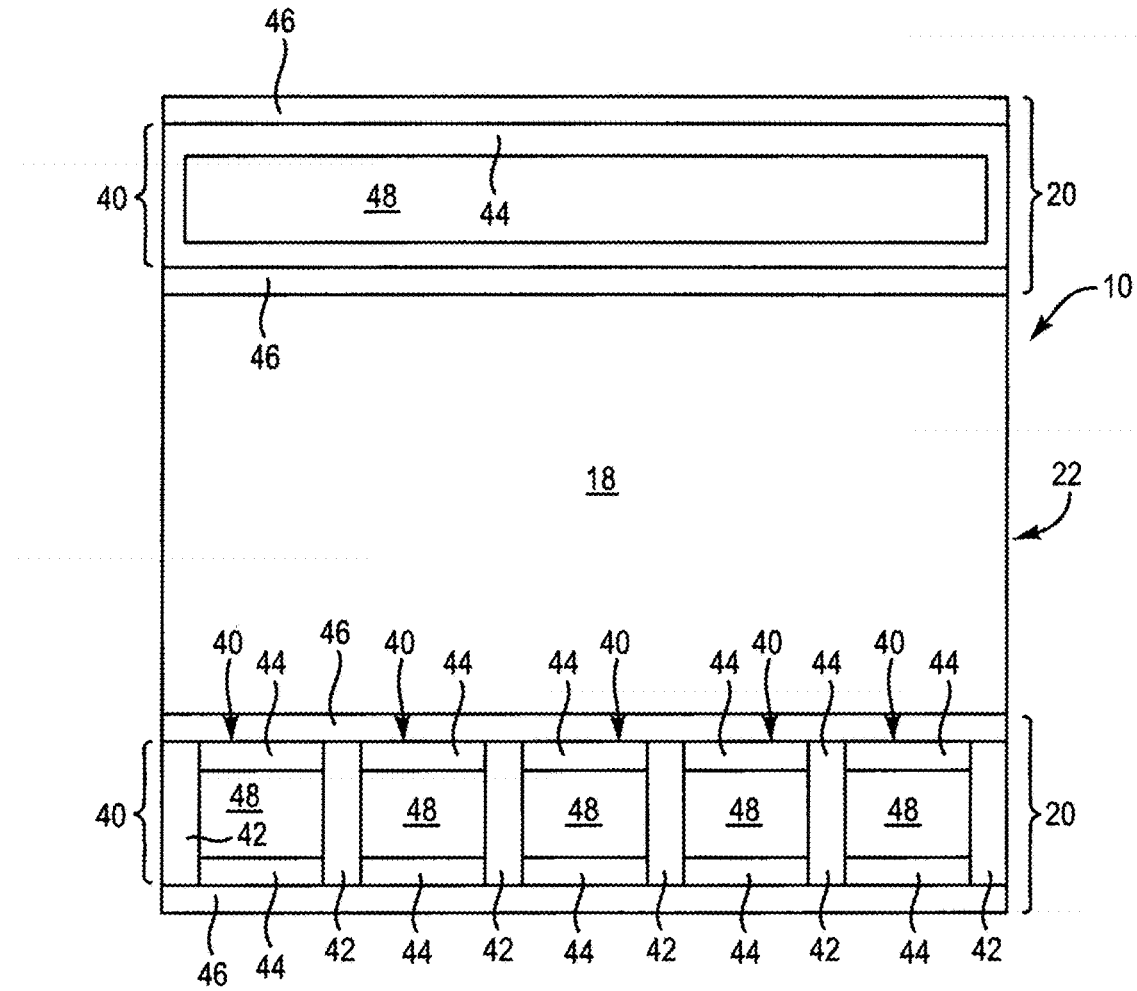
FIG. 4 is an end elevation schematic view of the lay up portion of the truss plate heat pipe, combined into the sandwich thermal control panel of FIG. 3.
Figure 5:
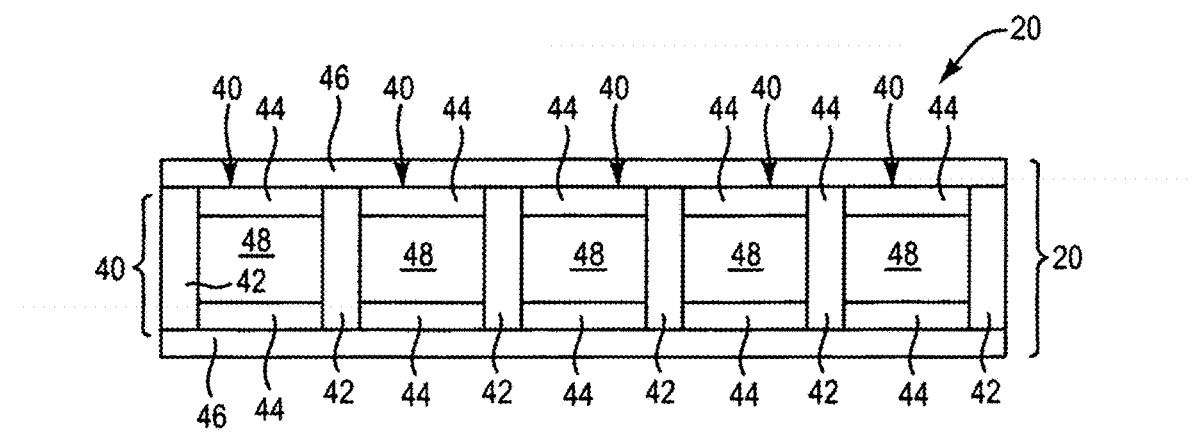
FIG. 5 is a schematic view of the end cross sectional view of a thermal control panel lay up of FIG. 4.
Figure 6A:
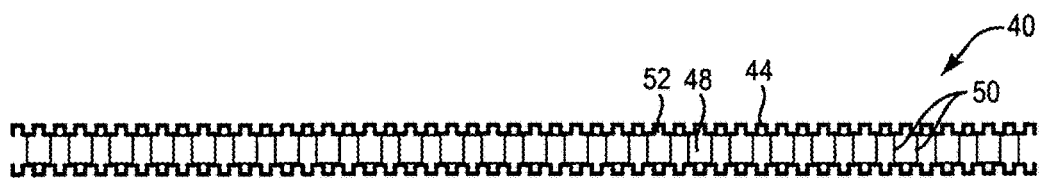
FIG. 6A is a cross-sectional, end, elevation view of the truss plates of a heat pipe, corrugated to form the outer layers of each truss plate heat pipe, and showing the corrugated mesh interconnected therebetween.
Figure 6B:
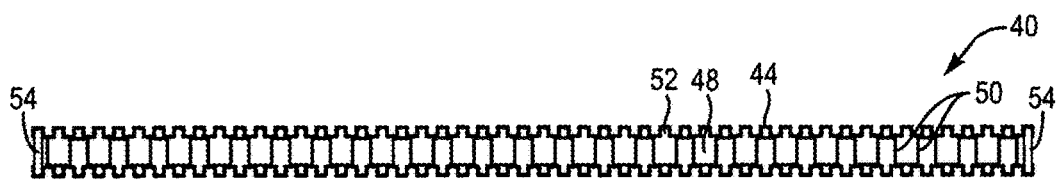
FIG. 6B is a cross-sectional, end, elevation view thereof showing the wall rails interconnected therebetween.
Figure 6C:
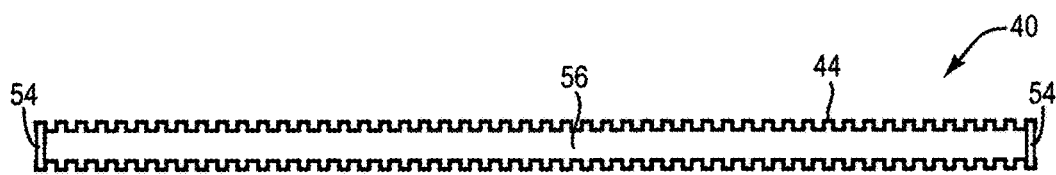
FIG. 6C is an end elevation view of the truss plate heat pipe, having the sealing end plate in place.
Figure 6D:
FIG. 6D is an opposite end elevation view thereof, showing an access port penetrating the sealing end plate and used for evacuation and fill after fabrication of the metal components, after which the port itself is also sealed.

Referring to FIGS. 4-5, while continuing to refer generally to FIGS. 1-24, a truss plate heat pipe 40 operates as a heat pipe. Typically, a heat pipe operates with a wick transporting a liquid phase of a working fluid in one direction. Meanwhile, a channel transfers vapor phase quantities of the working fluid back through to the opposite extremities of the heat pipe.

In the instant embodiment, each truss plate heat pipe 40 may include a spacer core 42 assembled on or in each wall 20. The spacer 42 operates something as a template and spacer to space apart the outer skins 44.

The sheets 44 are corrugated, and may typically be formed of an excellent thermal conductor such as copper. Meanwhile, the outer skin 46 of the wall 20 is a composite material. Thus, between two outer skins 46, is a truss plate heat pipe 40. A skin 46 serves as a structural strength component on each side of the truss plate heat pipes 40 formed of copper sheets 44 or other sheets 44 of some other metal, polymer, or the like.

A skin 46 formed of suitable material may be laid down and a spacer 42 may be placed thereon. The spacer 42 has portions in which its own material, typically a polymer or honey comb, is placed, and other places, locations, or regions where there is a partial or total evacuation or lack of material. In these evacuated or empty portions, are placed the strips 40 formed of pairs of sheets 44.

Between pairs of sheets 44, a vapor space 48 or simply a space 48 provides a region for passage of the vapor phase of a working fluid captured within the strip 40 formed by adjacent pairs of sheets 44.

One may note that the upper thermal control panel 20 contains a truss plate heat pipe 40. Likewise, below, the edges of the truss plate heat pipes 40 are not shown, but simple terminate schematically at the spacer 42. However, the edges of adjacent sheets 44 in a particular strip 40 are indeed bonded together as will be described hereinafter. However, the orientation of the bottom set or bank of strips 40 is orthogonal to the orientation of the bank of truss plate heat pipes 40 on the opposite side of the inner core 18. Thus, heat transfer may occur much more readily along the length of a truss plate heat pipe 40 than crossways across the width thereof. The spacers 42 create effective thermal resistances or thermal gaps between adjacent strips 40.

Referring to FIG. 5, while continuing to refer to FIGS. 4-5, and FIGS. 1-24 generally, a single thermal control panel 20 is shown schematically with the stack up of outer skins 46 and inner truss plate heat pipes 40, formed of exterior sheets 44 enclosing a vapor space 48.

Figure 7:
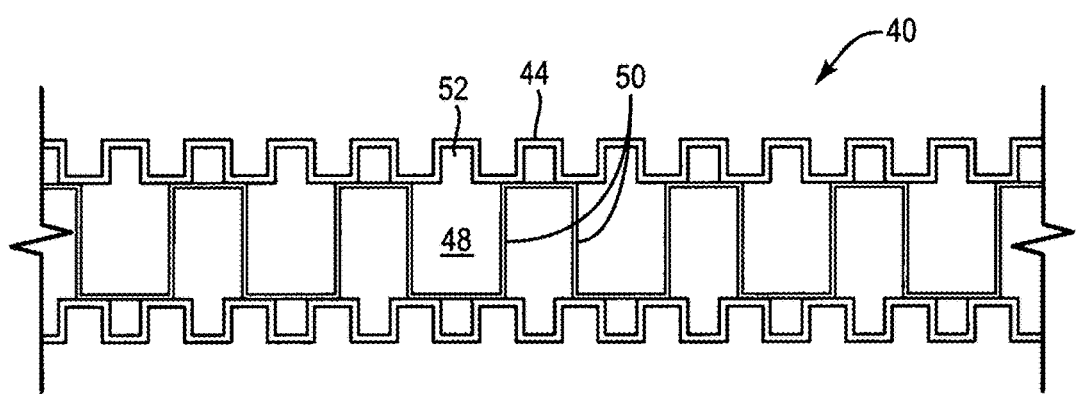
FIG. 7 is an end elevation view of a truss plate heat pipe of FIGS. 6A through 6D, having the corrugated mesh installed between the layers of the corrugated metal.
Figure 8:
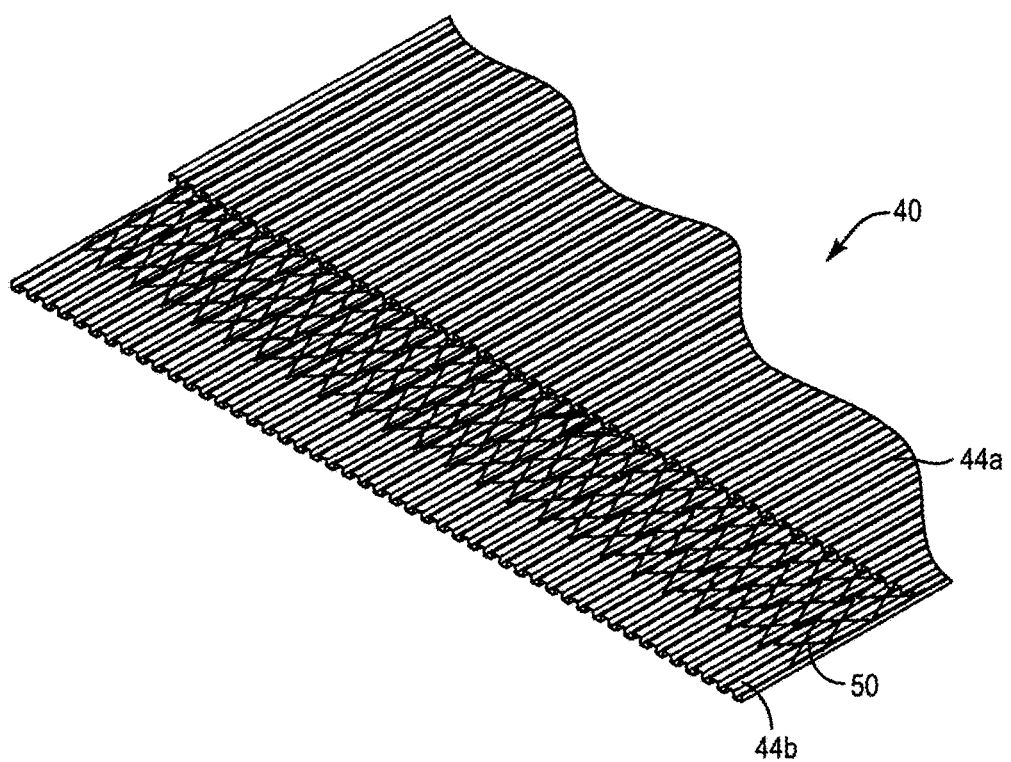
FIG. 8 is a cutaway, perspective view of one embodiment of the corrugated metal sheets, partially cut away to show one embodiment of a metallic mesh spacing apart the metal sheets.

Referring to FIGS. 6A through 6D, as well as FIGS. 7 and 8, while continuing to refer to FIGS. 1-24, the sheets 44 are spaced apart by a mesh 50, such as expanded metal, screen, or the like. The mesh 50 is formed to also present a corrugated aspect creating the vapor spaces 48 therein. Meanwhile, the mesh 50 spaces apart the corrugated sheets 44 in order to provide additional truss-like strength at reduced weight.

The mesh 50 at the locations where it contacts the sheets 44, at their internal extremities of their corrugations, also defines the liquid space 52 or the spaces 52 carrying liquid. Thus, the vapor spaces 48 carry vapor in one direction, from a comparatively hotter region where the vapor is formed, back to the opposite end or elsewhere of each strip 40, where the comparatively cooler temperatures condense the vapors in the vapor space 48 to liquid. The liquids, then move by capillary action through the spaces 52, returning to be vaporized again at the comparatively hotter end of the truss plate heat pipe 40.

As a practical matter, the sheets 44 may be brazed together by placing walls 54 or rails 54 captured within the last, or near the last corrugation within each sheet 44. The rails 54 or walls 54 are sized to fit within the corrugation dimensions where they may be bonded by brazing or the like. It has been found that a silver and copper eutectic operates as a suitable brazing material, drawing into the small spaced between the mesh 50 and sheets 44 when melted.

Likewise, the ends of the truss plate heat pipes 40 need to be sealed. Each truss plate heat pipe receives an end wall 56 or rail 56 fabricated to match the shape of the corrugated sheets 44. Thus, the end walls 56 are fitted in between the sheets 44, within the internal corrugations or cavities of each of the sheets 44, where these rails 56 also may be brazed.

Figure 9:
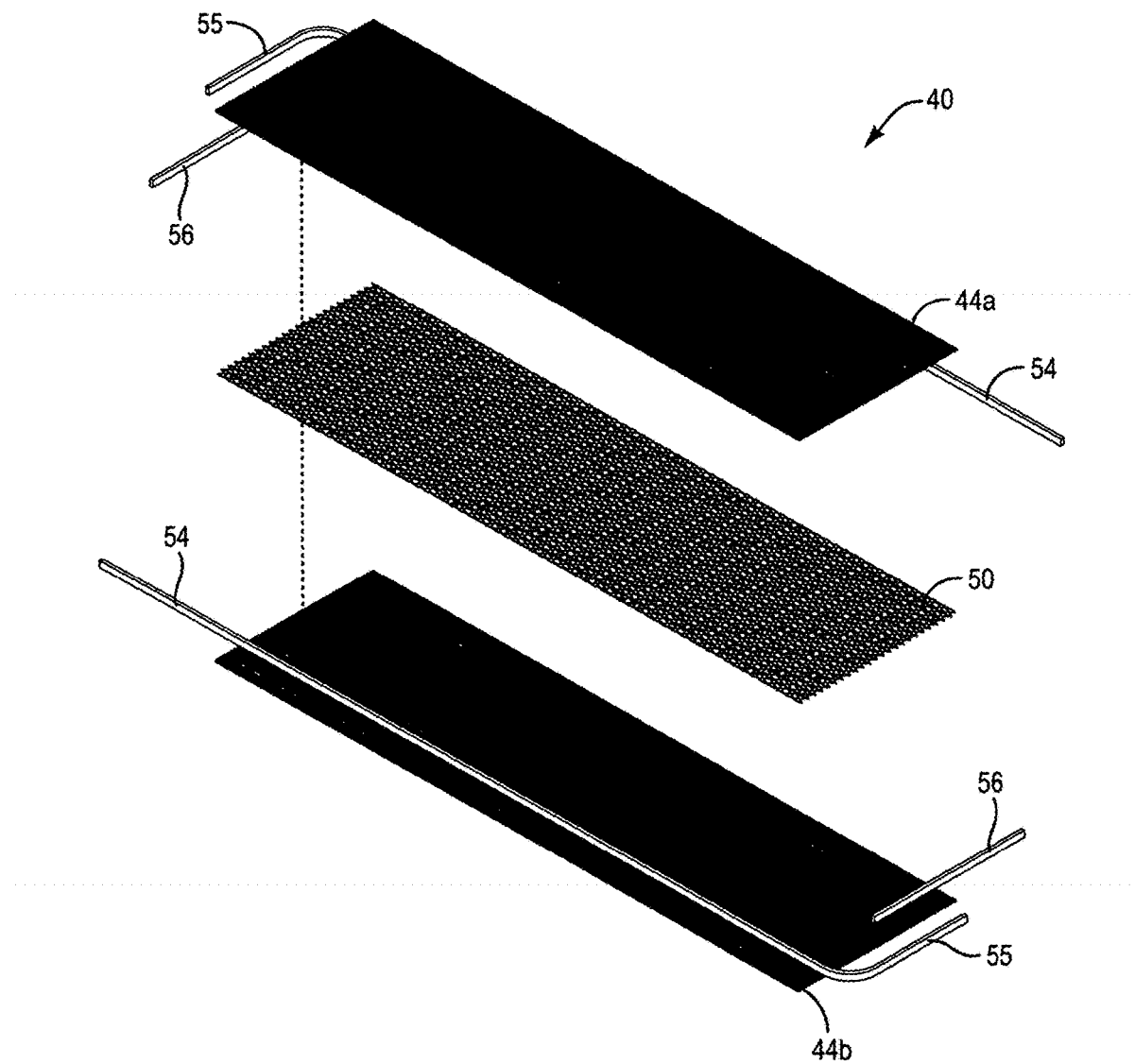
FIG. 9 is an exploded view of a truss plate heat pipe showing the principal components that are brazed together to form a sealed truss plate heat pipe.

Referring to FIG. 9, the rails 54 may be provided with a portion 55 or handle 55. The handle portion 55 may simply be a continuation of the rail 54, bent at an angle in order to provide a cranking or leverage advantage in order to manipulate each rail 54 into position.

By grasping the handle portion 55, a technician may place each rail 54 within the corrugation where it must fit, and also rotate it or manipulate it in order to engage the rail 54 with the corrugation of the sheet 44 opposite. Thus, for example, one may place the rail 54 in the outermost corrugation of the bottom sheet 44b, and then manipulate the handle 55 fit the rail 54 into the outermost corrugation corresponding thereto in the upper sheet 44a.

Figure 10:
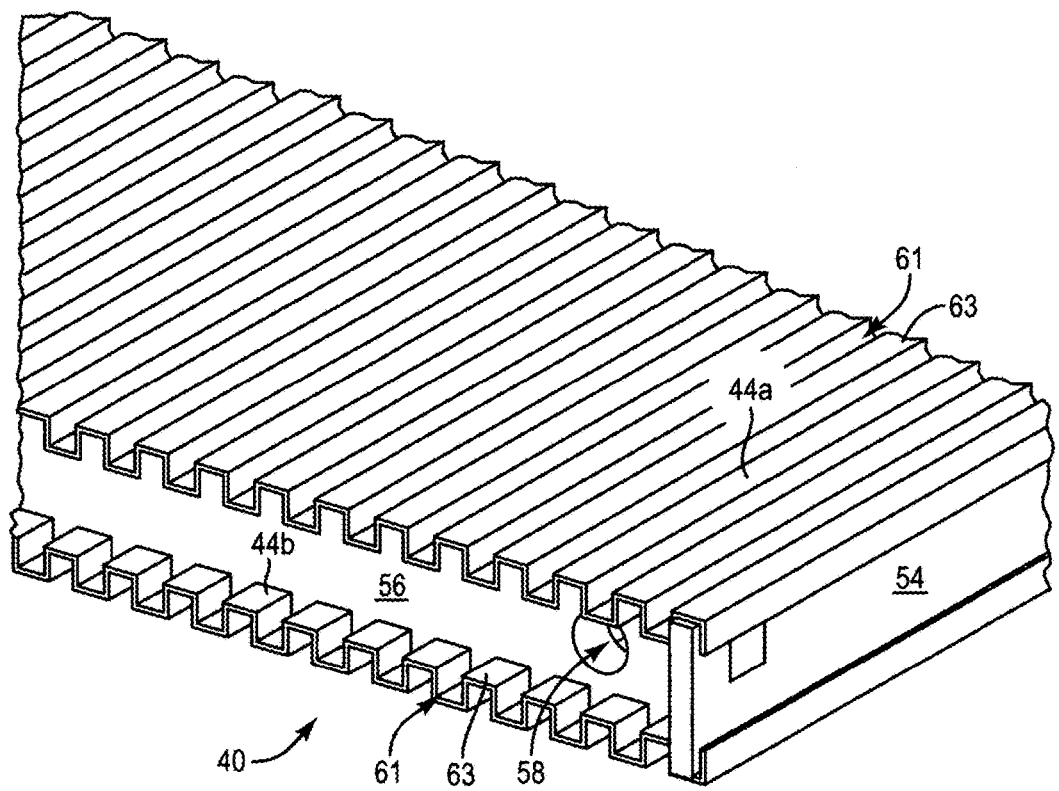
FIG. 10 is a perspective view of a portion of the assembly that forms a truss plate heat pipe.
Figure 11:
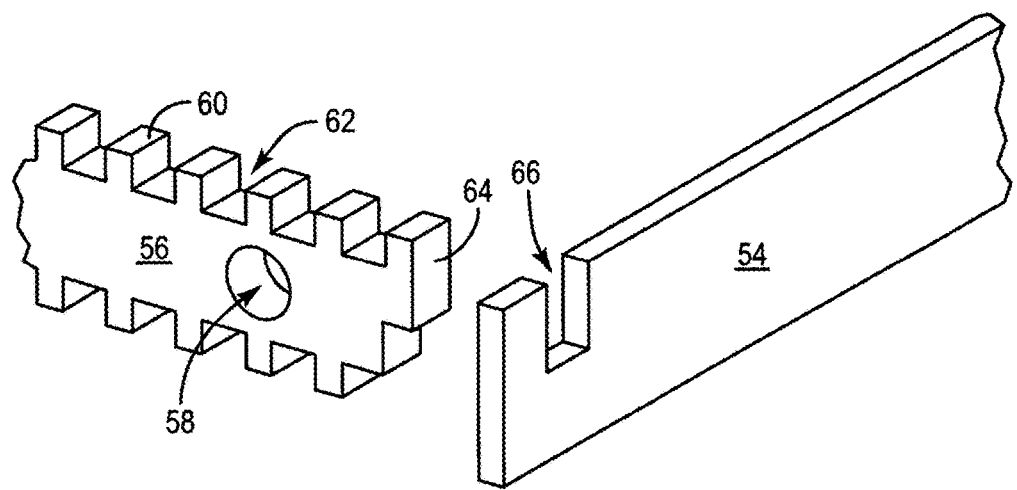
FIG. 11 is a perspective view of the end wall and side wall of the assembly of FIG. 10.
Figure 12:
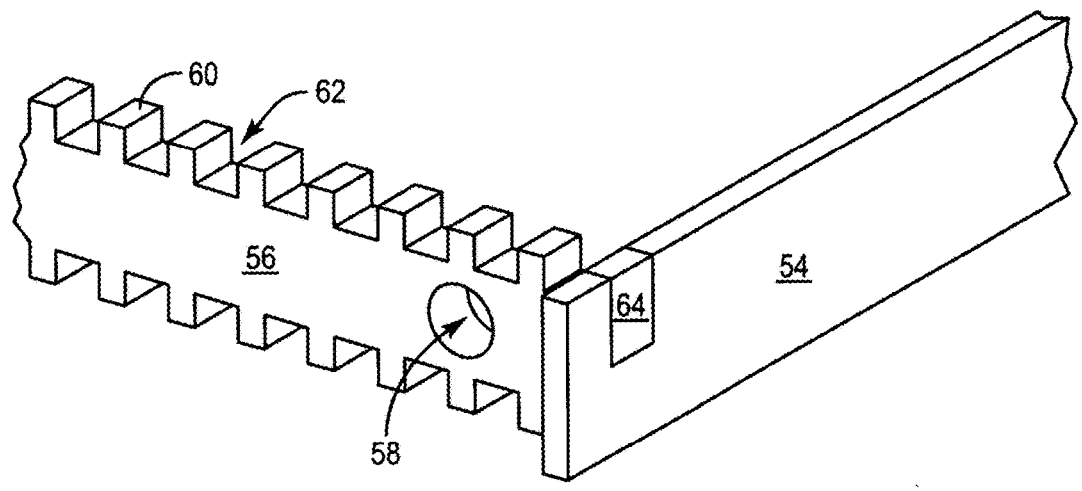
FIG. 12 is a perspective view of the end and side walls of FIG. 11 assembled together.

Referring to FIGS. 10-12, while continuing to refer generally to FIGS. 6-9 and FIGS. 1-24, the details are illustrated for the assembly of the sheets 44 with the rails 54, 56. For example, the rail 54, once properly located, and engaged with the rail 56 may be clipped off flush with the end of the sheets 44. For example, in FIGS. 11-12, the end rail 56 is shown, first separated, and then engaged with the rail 54. The assembled rails 54, 56 can slide along with respect to the sheets 44. Thus, the sheet 44a may be moved along the rail 54 in order to provide access by the end rail 56 to the engagement with the side rail 54.

For example, each of the end rails 56 may be provided with lands 60 and grooves 62 matching the corresponding corrugation grooves 61 and lands 63 of the sheets 44. Thus, the corrugations of the sheets 44 fit within the grooves 62. Meanwhile, the lands 60 fit within corrugations in the sheets 44. A key 64 is a portion of the end rail 56 shaped to fit within a key way 66 in the side rails 54. Thus, the key 64 fits in the key way 56, fixing the end rail 56 with respect to the side rail 54.

Once the entire strip 40 has been assembled with both sheets 44a, 44b, the side rails 54 and the end rails 56, the constituents may all be bonded together with a suitable brazing material and technique. However, an aperture 68 provides for receiving a tube 30. The aperture 58 is sized to receive a tube extending thereinto. The tube 30 may be brazed into the aperture 58 just as the corrugated sheet 44 is brazed to the rail 54 or sidewall 54, and the end rail 56 or end wall 56. Upon completion of brazing, and cooling of the strip 40, a vacuum may be drawn on a tube 30 in order to test the seal, and assure that the brazing has been complete and is leak tight.

Figure 13:
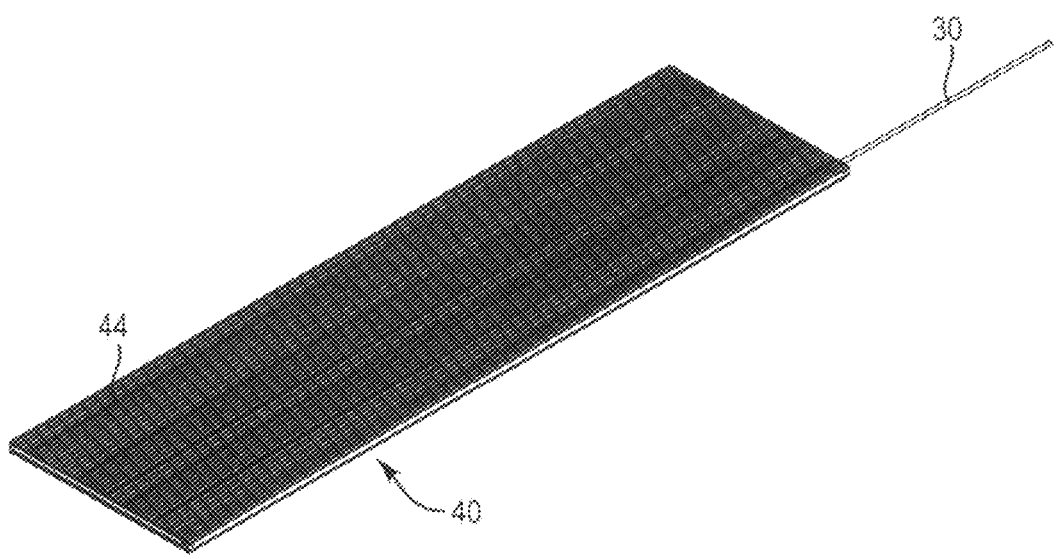
FIG. 13 is a perspective view of the assembled truss plate heat pipe of FIGS. 6-12.
Figure 14A:
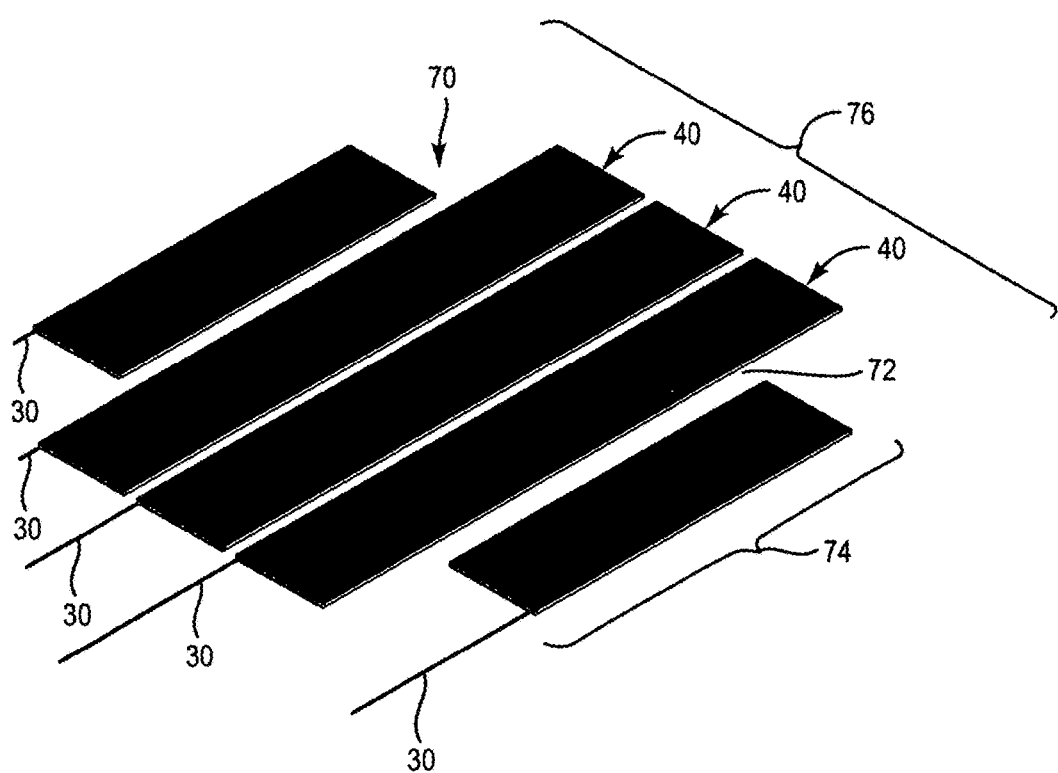
FIGS. 14A, 14B are a perspective views of alternative embodiments of an array of truss plate heat pipes assembled together.
Figure 14B:
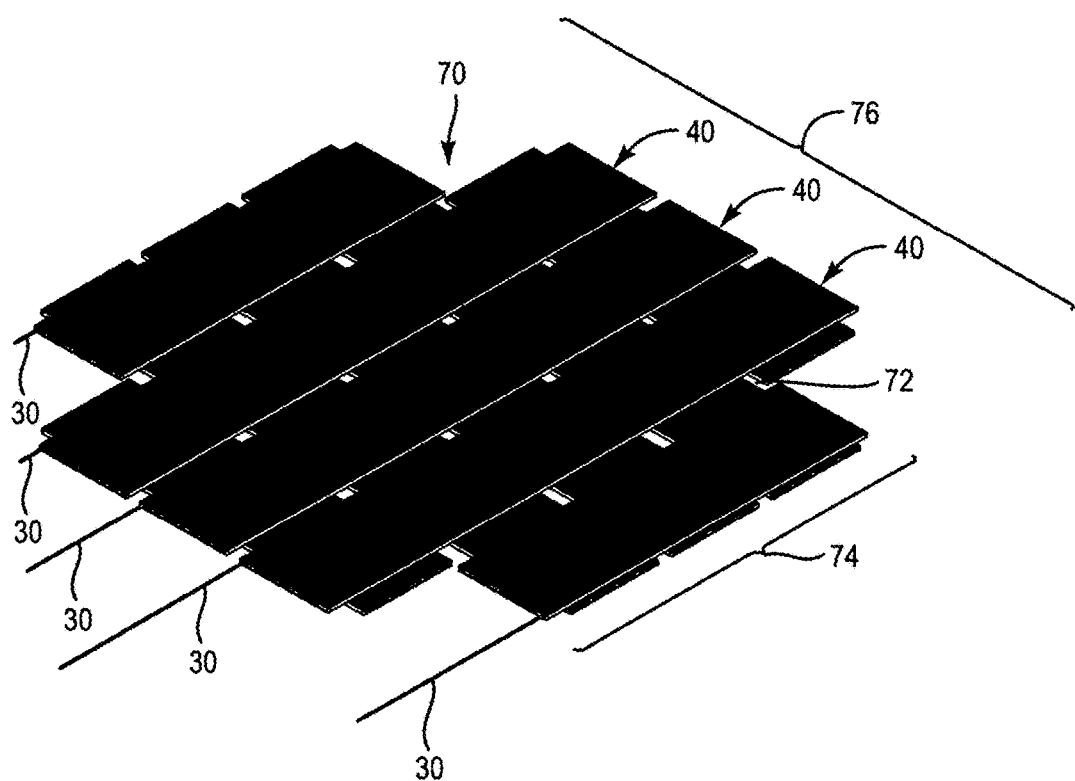
Figure 15A:
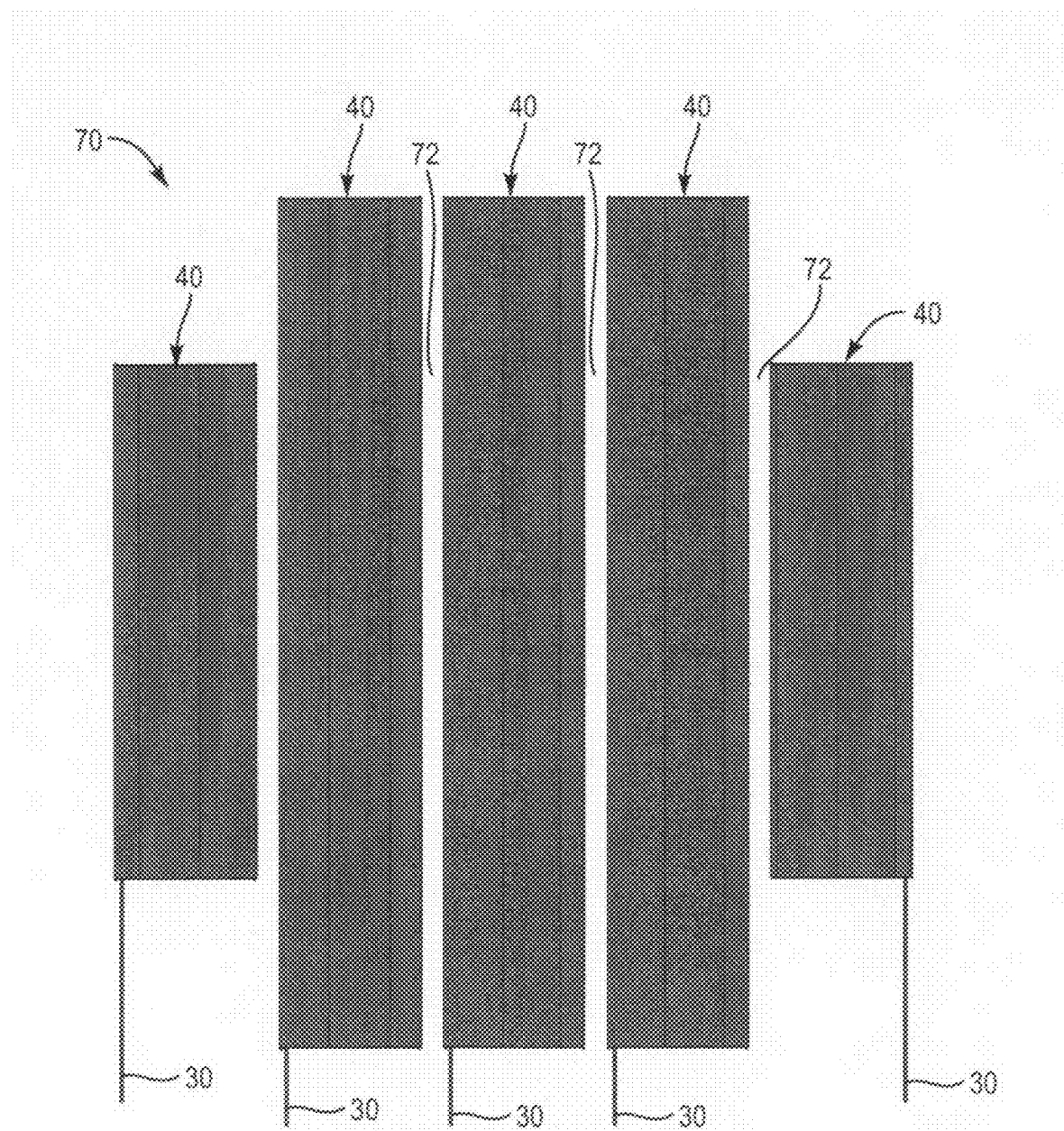
FIGS. 15A, 15B are a top plan views of the arrays of truss plate heat pipes of FIGS. 14A, 14B, respectively.

Referring to FIG. 13, the assembled truss plate heat pipe 40 is illustrated with the sheets bonded together with their respective side walls 54 and end walls 56, and with the tube 30 brazed into the aperture 58 of the end wall 56. The assembly of the strip 40 illustrated in FIG. 13 contains all of the components illustrated in FIGS. 6-12 except for the handles 55 of the side rails 54. Those handles 55 have been clipped off before brazing, or afterward, but before use or installation.

The truss plate heat pipe 40 is itself a truss. That is, the mesh 50 has been brazed to the sheets 44. The sheets 44 have a certain number of their corrugations spanned by the mesh 50. In one embodiment, the period of the corrugations in the sheets 44 is half that of the corrugations in the mesh 50. Thus, about half the corrugations internal to the truss plate heat pipe 40 are bridged by the mesh 50. Others may remain completely unobstructed and open. Since the mesh 50 is a mesh, the corrugations are not completely closed, but rather the liquid space 52 or the corrugation 52 is simply bridged periodically by the mesh 50.

The mesh 50 also extends between the sheets 44. Thus, in bending, the sheets 44 may be thought of as tensile or compression members at the outermost extremities of the strip 40, while the mesh 50 spaces these sheets 44 apart from one another, thus creating a truss. Moreover, the sheets 44, being brazed to the mesh 50 are typically connected at every periodicity of contact with the mesh 50.

Thus, the center portion of each strip 40 is not at liberty to separate between the sheets 44. Rather, the sheets are maintained together at their distance apart throughout the strip 40. Pressure tests show that the brazed mesh 50 bonded to the adjacent or facing sheets 44 provides a substantial strength against internal pressures. Pressures of 6.5 atmospheres and more have been tested, without failure of the truss plate heat pipe 40. The mesh 50 forms a lattice work or truss lattice between the sheets 44.

Referring to FIGS. 14-19, while continuing to refer generally to FIGS. 1-24, individual truss plate heat pipes 40 may be arranged in an array 70. An array 70 may include several, typically five, strips 40 each lying parallel to all others in the array 70. In other embodiments, an array 70 may include sub arrays 70 of parallel batteries 74 or banks 74 of strips 40 orthogonal to other batteries 76 or banks 76 of thermal truss plate heat pipes 40. Even with an array 70 within a single wall 20 having orthogonal batteries 74, 76 of strips 40, clearances 72 between the adjacent strips 40 still provide locations for the mounting apertures 28 to pass through the wall 20, the arrays 70, and the entire lay up 22 as discussed above.

Nevertheless, it has been found that weight-sensitive applications may suffer in meeting their maximum weight limitations if the array 70 includes two orthogonal batteries 74, 76 of thermal truss plate heat pipes 40. Thus, in one presently contemplated embodiment, the single battery 74 is mounted within a single thermal control panel 20. Meanwhile, an opposite wall 20 in the same lay up 22 includes the second battery 76 as its array 70.

It has been determined that the thermal conductivity of an aluminum honey comb core 18 has sufficiently distributed contact, and sufficient cross sectional area, that even a thickness of half an inch between thermal control panels 20 straddling a core 18 provides sufficient heat transfer rates to meet the functional benefits provided by a sandwich thermal control panel 10 in accordance with the invention.

For example, heat transferred into any edge of a truss plate 10 will be transferred into a rail 11. For example, heat may be transferred from one joining rail 14 into the lay up 22. Of course, the lay up 22 includes two walls 20, each having a preferential heat transfer direction orthogonal to the other. Most of the heat will transfer most rapidly into the end of the batteries 74, 76 or array 70 that is in contact with the rail 11 where heat is being transferred into the lay up 22. Of course, a certain amount of heat will also transfer into the opposite battery 76, 74 and be transferred along the extent of the rail 11 where the heat is being added.

Meanwhile, heat may also be transferred directly through the skin 46 on the overall surface of a sandwich thermal control panel 10. For example, the surface of a lay up 22 may have a device, such as powered electrical equipment connected thereto. Accordingly, the skin 46 passes heat through its thickness and directly into the sheet 44 of a truss plate heat pipe 40.

However, in transferring heat between and about sandwich thermal control panels 10, heat transferred in at, for example, a rail 11, such as a joining rail 14, will transfer easily into the ends of the thermal modules 40 or thermal truss plate heat pipes 40 that abut the rail 14. They will thus be able to transfer heat along their entire length, passing heat throughout their thermal control panel 20 on that side of the entire sandwich thermal control panel 10. Throughout the lay up 22, meanwhile, those portions of one wall 20 that are comparatively hotter then the portions of an adjacent thermal control panel 20 on the opposite side of the core 18 will then transfer heat therebetween. Accordingly, heat travels comparatively rapidly along each of the truss plate heat pipes 40, but still sufficiently, once distributed, through the core 18 and into the strips 40 of an opposite wall 20 within the same lay up 22.

In the foregoing manner, thermal objectives may be met, in any dimension. Notwithstanding the increased distance through the core 18, the increased resistance of the skins 46, and so forth, the honey comb 18 presents a substantial and distributed heat transfer area. The working fluid within each of the thermal truss plate heat pipes 40 can pass quickly through the liquid spaces 52 and vapor spaces 48 thereof. Thus, distribution throughout the full area of one wall of a particular lay up 22. One wall 20 thereof may then provide substantially increased area for heat transfer through the core 18 to the opposite wall.

Thus, heat may be transferred from a rail 14 across the lay up 22 to an adjacent or opposite rail 16. That is, heat may be transferred from a top rail 12a to a lower rail 12b, or vice versa. Moreover, heat may be transferred from a side rail 14, 16 to one of the top rail 12a or bottom rail 12b in similar manner. Moreover, heat may be transferred from a rail 11 of one sandwich thermal control panel, through the frame 24 of that truss plate 10 to the connected frame 24 of an adjacent truss plate 10, and then transfer through the second sandwich thermal control panel 10.

Figure 17:
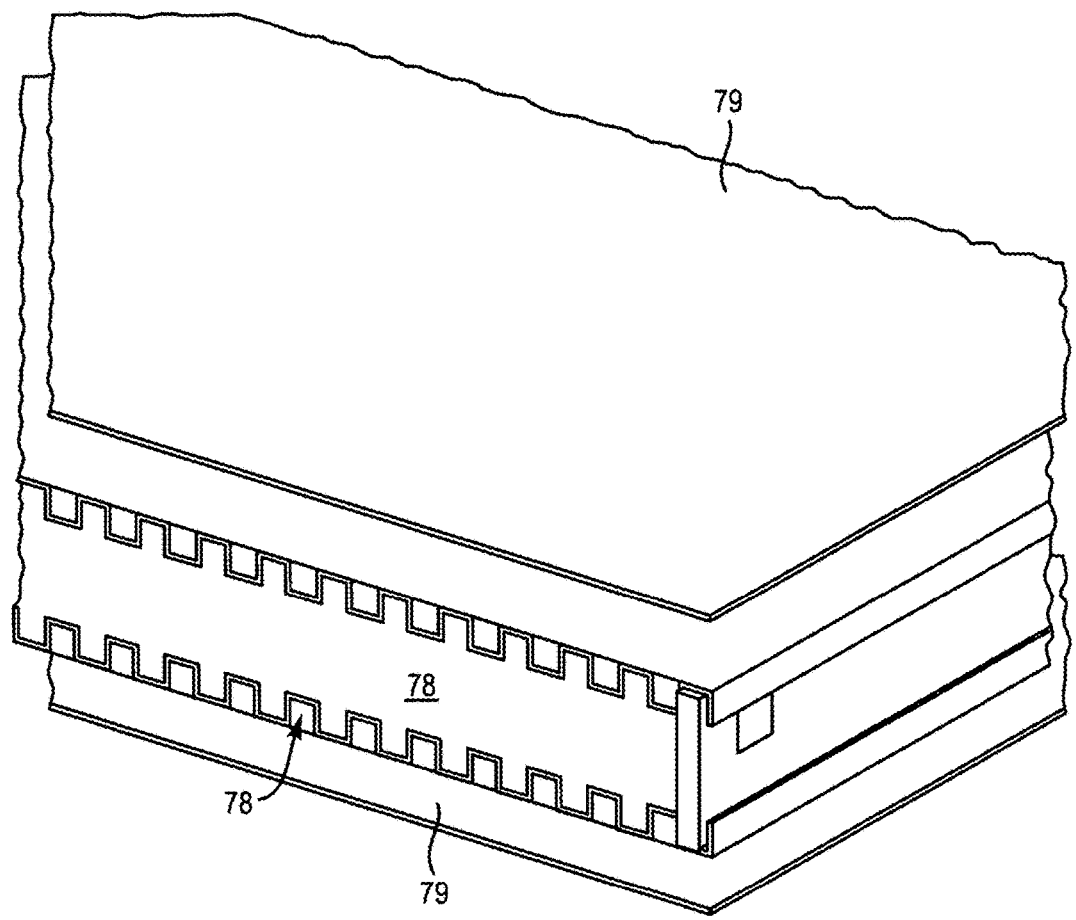
FIG. 17 is a perspective view of a portion of a truss plate heat pipe showing the position of the screeded polymer filling in the corrugations, and the bonding layers to secure the strip later to the outer skins and spacer core.

Referring to FIG. 17, each truss plate heat pipe 40 may be filled in its outer grooves 61 with a filler 78 to eliminate the air gap and improve thermal conductivity. Also a sheet 79 for bonding the sheet 44 or strip 40 to the skin 46 may be provided. A similar sheet 79 of bonding material such as a partially cured epoxy, a thermo plastic, or other polymer may bond each truss plate heat pipe 40 to the honey comb core 18. Shrinkage of the filler 78 is typically sufficient to provide relief into which the sheet 79 may follow during pressure and cure. The core 18 has airspace. The truss plate heat pipes 40 are in intimate contact with the core 18 and skin 46, on opposite sides thereof, as the material of the sheet 79 deforms under heat and pressure to move away from the locations of that contact. The resulting effective thermal conductivity through each wall 20 and each plate 10 is unexpectedly excellent in part due to this intimate contact.

Figure 18:
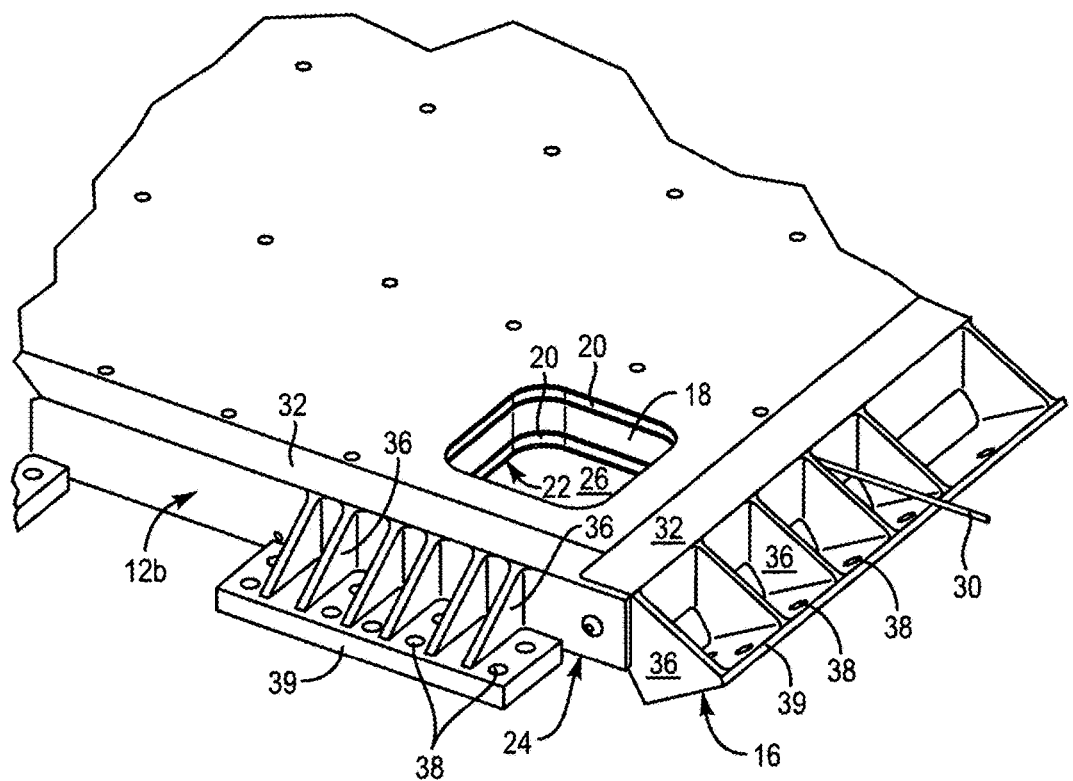
FIG. 18 is a perspective view of one corner of a sandwich thermal control panel in accordance with the invention, illustrating the framing, rails forming the framing, and the lay up as seen near one of the service apertures therethrough.
Figure 19:
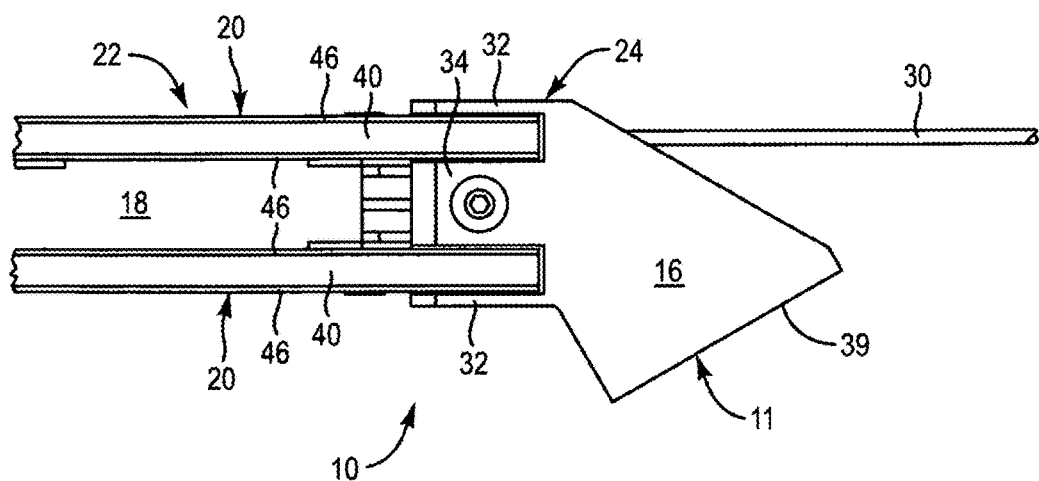
FIG. 19 is an end elevation view of the angled edge rail of a sandwich thermal control panel in a position to be connected to a corresponding rail of an adjacent sandwich thermal control panel shown are two thermal control panels spaced with honey comb attached to the metal frame.

Referring to FIG. 18, the apertures 38 are shown in various rails 11,12,16. Likewise, the relief formed in each respective rail 12b, 16 is illustrated to show the fit and contact. Contact may be improved by adding bonding materials to fill any gaps, using thermal greases, epoxy, or any other suitable contact mechanism between the flanges 32 and the skins 20 of the lay up 22.

In some embodiments, the rail 16 may be formed to have angles that are orthogonal or non-orthogonal between the adjacent faces thereof. For design reasons, that angle may be something other than 90 degrees or a right angle. Meanwhile, the rail 12 may serve as a mounting rail, having one portion extending parallel to the flange 32, and supporting apertures 38 for fastening that ear 39 to some structural substrate, such as a satellite frame, aircraft frame, electronic rack, electronic housing, or the like. In the illustrated embodiment, the non-orthogonal position of the ear 39 of the rail 16 with respect to the flange 32 thereof may provide for turning corners. Similarly, corners may be turned abruptly, even orthogonally if the ear 39 is exactly parallel to the flange 32 of the rail 16. This may permit access to fasteners through the apertures 38 to fasten into a corresponding side rail 14 of an adjacent frame 24 in an adjacent sandwich thermal control panel 10.

Figure 16A:
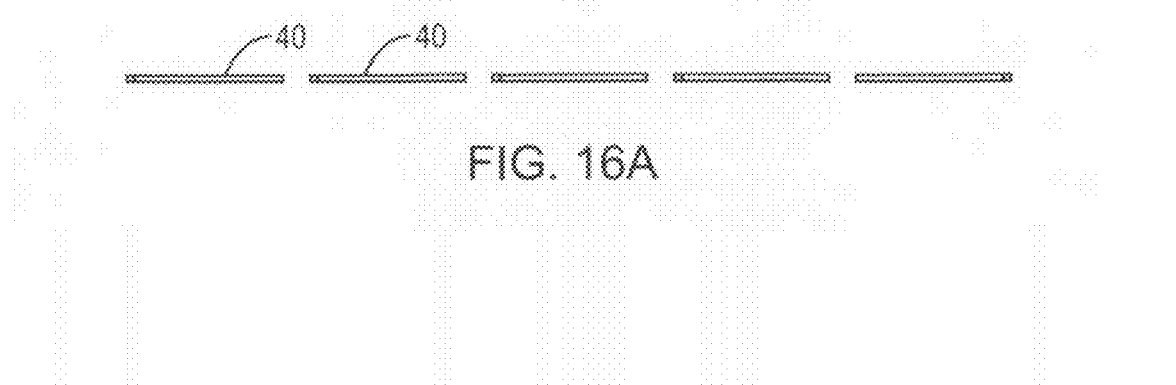
FIGS. 16A, 16B are an end elevation views corresponding to FIGS. 14A,14B, respectively.
Figure 15B:
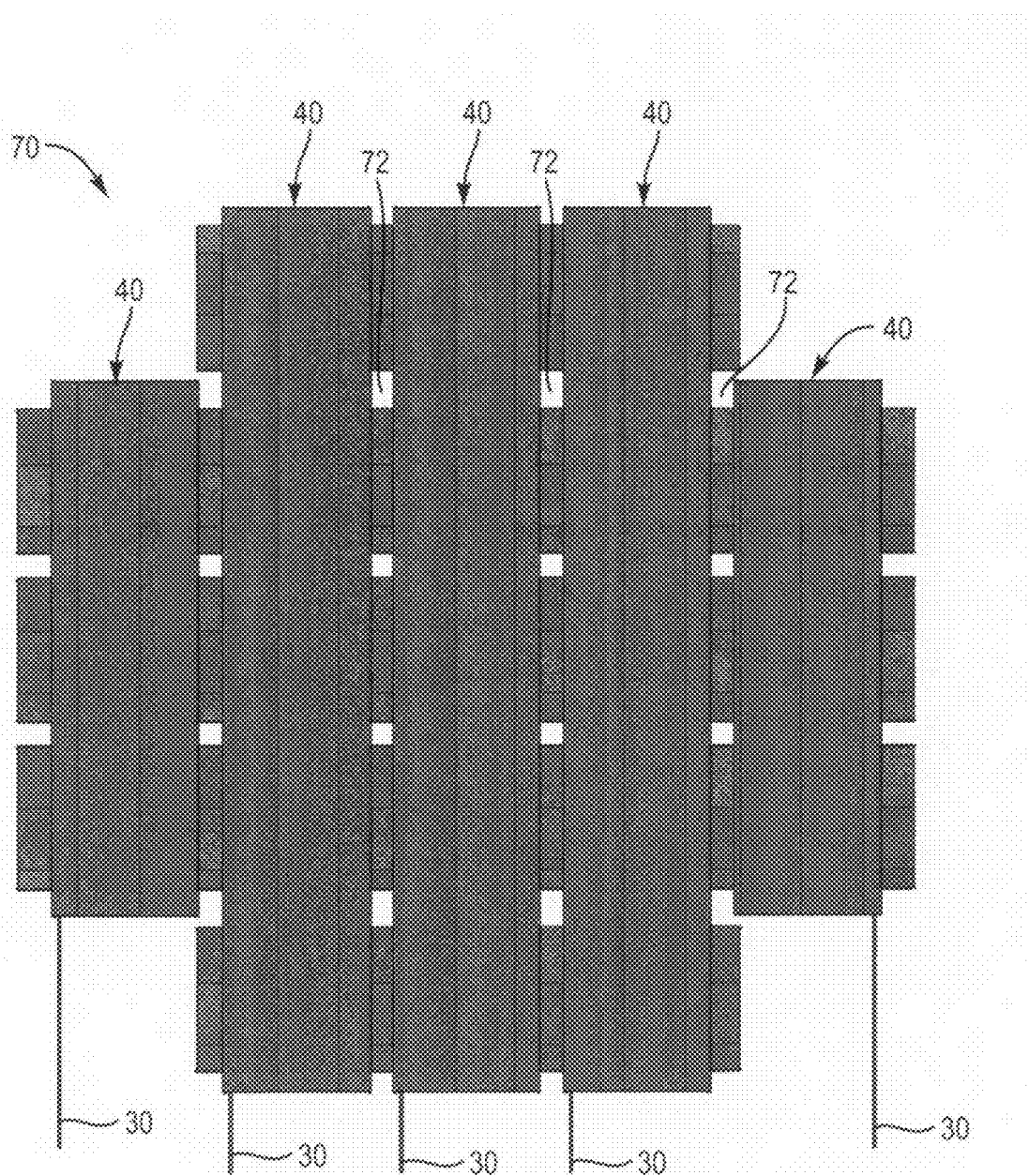
Figure 16B:
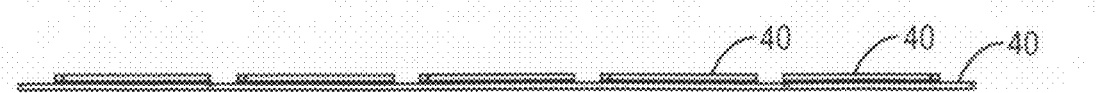

Referring to FIG. 16, the embodiment of FIG. 10 is shown, wherein the ear portion 39 of the rail 16 is angled at something other than parallel to the respective flange 32. Likewise visible is the insertion of the spacer 34. The spacer operates as an internal flange opposite the outer flange 32 to capture the wall 20 at the skins 46 thereof. This will secure the lay up 22 into the rails 11 framing 24 the sandwich thermal control panel 10.

Figure 20:
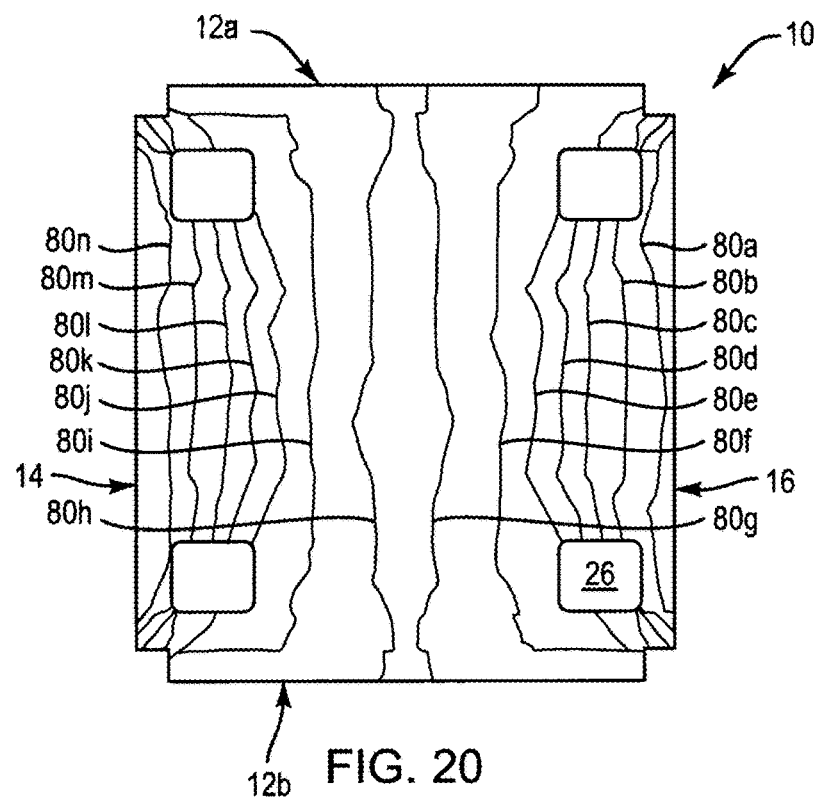
FIG. 20 is a top plan view of a sandwich thermal control panel in accordance with the invention illustrating the modeled isothermal lines of heat transfer in transferring heat from one side or edge across the truss plate to the opposite edge, wherein top and bottom walls are made of arrays of truss plate heat pipes oriented orthogonal to one another and connected by aluminum honey comb bonded thereto and therebetween.
Figure 21:
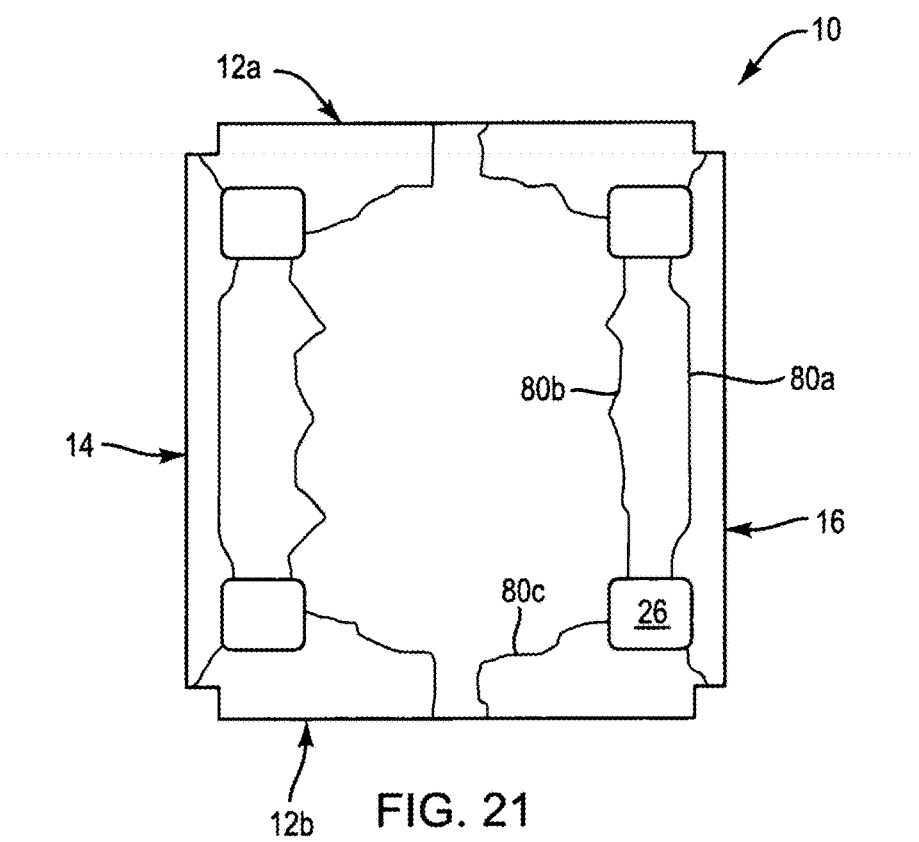
FIG. 21 is a top plan view of the isothermal lines for a different heat transfer orientation test modeled for the sandwich thermal control panel for heat added at one edge and extracted from an adjacent edge.

Referring to FIGS. 20-21, computer modeling of the thermal response of the truss plate 10 is illustrated. In the example of FIG. 20, heat is being transferred across between the opposite rails 14, 16. Accordingly, the isothermal lines 80 from 80a to 80n illustrate the initial high gradients near the edges, and the general thermal stability as heat is transferred between walls 20 near the central portion thereof.

The illustration of FIG. 21 shows typical isothermal lines when heat is transferred from a top or bottom rail 12 to one of its adjacent side rails 14,16. In this embodiment, a more general and less steep gradient exists in the central portion of the truss plate 10. One reason for the reduced gradient is that heat must be transferred throughout all of the truss plate heat pipes embedded in the truss plate 10. Heat distributes on one wall 20, or in one wall 20, in order to effectively transfer through as much available surface area as possible to arrive through the core 18. The same process occurs in reverse at the opposite wall 20, where the heat may then transport in an orthogonal direction to that preferred by the original wall 20.

Figure 22:
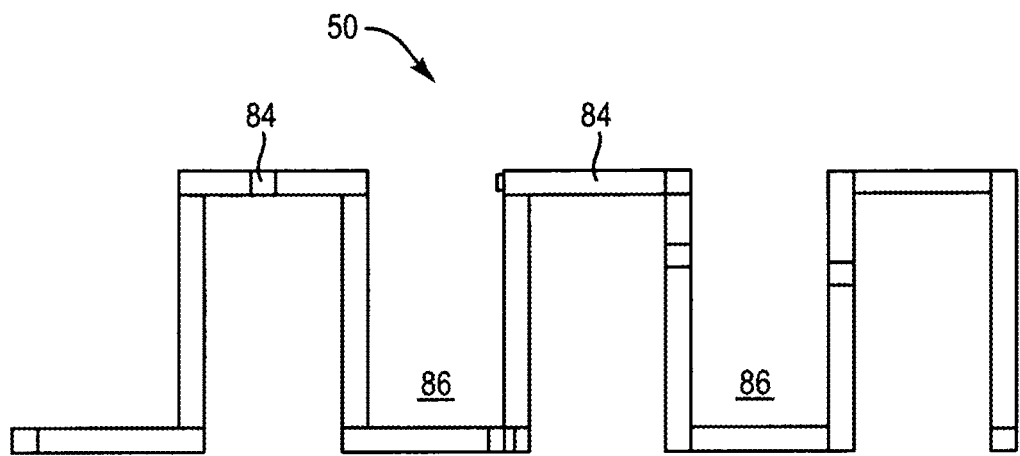
FIG. 22 is an end elevation view of corrugated mesh truss structure of the flat heat pipe such as that illustrated in FIGS. 8-9.
Figure 23:
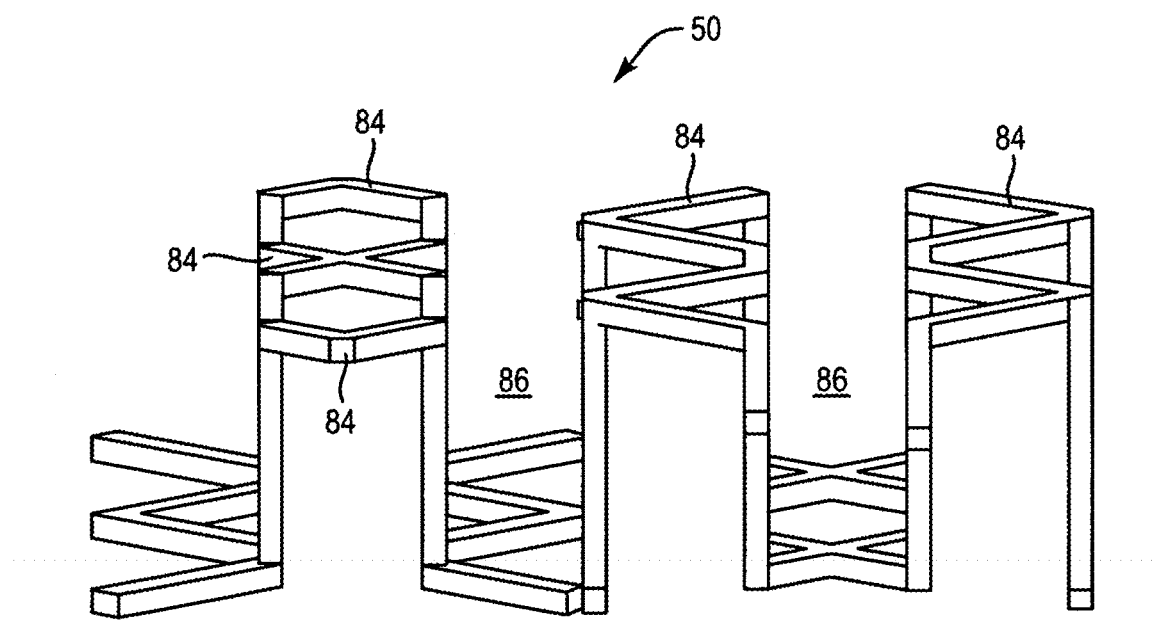
FIG. 23 is a perspective view thereof, wherein the rear end of the truss structure mesh is tilted upward to show more of its linear extent.
Figure 24:
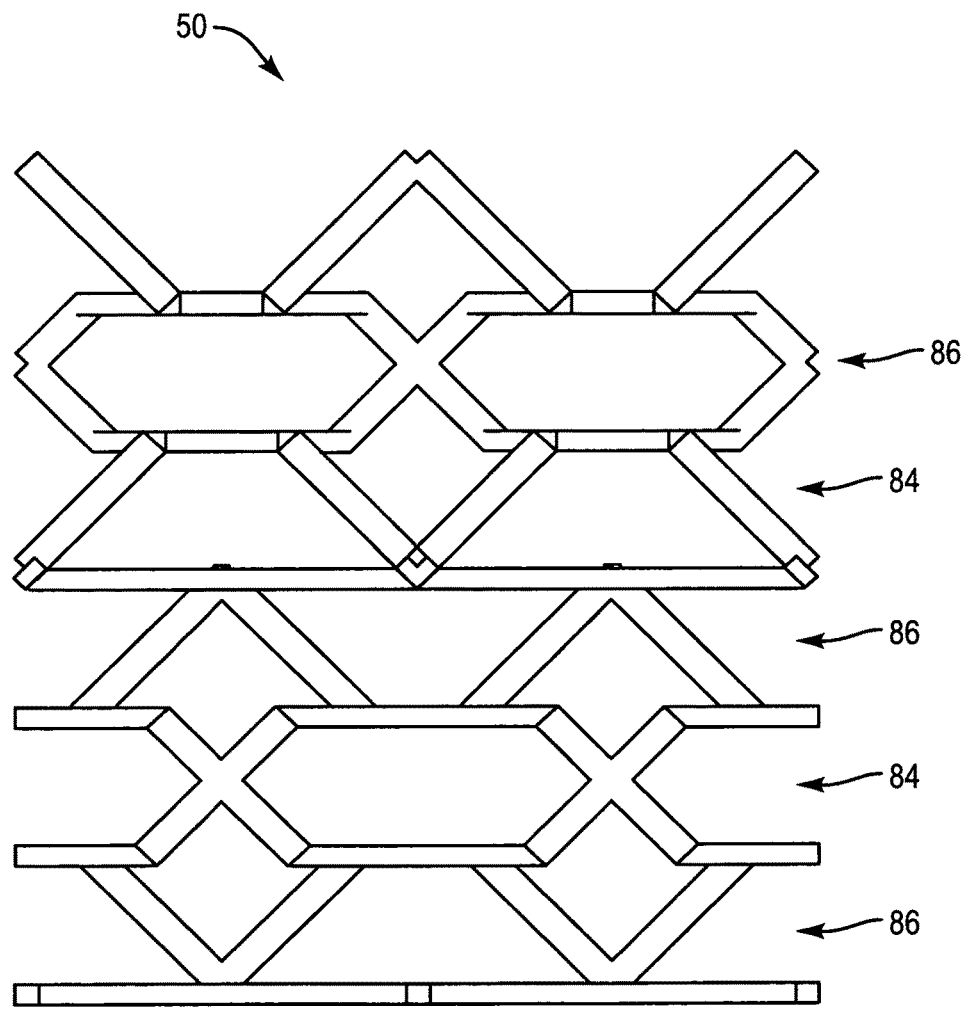
FIG. 24 is a top plan view of the truss structure mesh of FIGS. 22-23 in one embodiment thereof.

Referring to FIGS. 22-24, the mesh 50 may include peaks 84 and valleys 86. The peaks 84 may be trapezoidal, triangular, or rectangular as illustrated here. It has been found that the rectangular orientation of the peaks 84 and valleys 86 seems to work better, resulting in less capillary action in the regions of vapor transport. By the rectangular configuration of the peaks 84 and valleys 86, the dynamics of the vapor flows improve substantially, while the liquid flows are still adequate.

FIG. 23 illustrates the end view of the mesh of FIG. 22 tilted with the back somewhat moved upward in order to show the shape of the mesh. Again, multiple peaks 84 of the mesh 50 can be seen. Similarly, FIG. 24 shows a top plan view with the various angled mesh resulting from an expanded metal stamped into a corrugated format. Here, rows of peaks 84 are show with rows of the bottoms 86 or valleys 86.

The present invention may be embodied in other specific forms without departing from its fundamental functions or essential characteristics. The described embodiments are to be considered in all respects only as illustrative, and not restrictive. All changes which come within the meaning and range of equivalency of the illustrative embodiments are to be embraced within their scope.

What is claimed and desired to be secured by United States Letters Patent is:

1. An apparatus configured as a heat pipe having a heated region, cooled region, working fluid, vapor path, and condensate path supporting capillary movement of a condensate of the vapor, all within a single, continuous, sealed volume, wherein the vapor path carries a vapor of the working fluid from the heated region toward the cooled region and the condensate path carries a condensate of the working fluid from the cooled region to the heated region, the heat pipe characterized by an interior surface, exterior surface, and thickness, width, and length, defining a thickness direction, a width direction, and a length direction, respectively, the heat pipe comprising:
   a first layer of foil;
   a second layer of foil juxtaposed to the first layer to define thereby the interior surface, exterior surface, thickness, width, and length;
   at least one of the first and second layers corrugated to form alternating grooves and lands, the grooves operating as channels between the lands;
   a mesh, corrugated and positioned to provide a first, wicking, portion of the mesh extending across the grooves and a second, truss, portion of the mesh extending between the layers;
   a bond, fixing the second portion to extend between the interior surfaces on the first and second layers, respectively, to support a vapor pressure of the working fluid by constraining the first and second layers in the thickness direction.

2. The apparatus of claim 1, further comprising:
   a plurality of the heat pipes;
   a first set of the plurality arranged in parallel in a first width direction thereof;
   a second set of the plurality arranged in parallel in a second width direction thereof; and
   the first and second width directions being orthogonal to one another.

3. The apparatus of claim 1, further comprising; a plurality of heat pipes, arranged in a first set and a second set; the first set being arranged co-planar with each other and adjacent in the respective width directions thereof; and the second set being arranged co-planar with each other and adjacent in their respective width directions; and the first and second sets being adjacent one another in the thickness directions and oriented orthogonal to each other in their respective length directions.

4. The apparatus of claim 3 comprising the bond, securing the first mesh portion bonded to extend across the grooves.

5. The apparatus of claim 4, further comprising:
   the mesh, formed as a continuous, corrugated sheet, corrugated to form the first portion and second portion and provided with apertures extending through a matrix of metal.

6. The apparatus of claim 1, wherein a first aspect ratio of the thickness to the width is less than one and a second aspect ratio of the width to the length is less than one to one.

7. The apparatus of claim 6, wherein at least one of the first and second aspect ratios is less than one to five.

8. The apparatus of claim 1,
wherein the first layer constitutes a first wall and the second layer constitutes a second wall, at least one of the first and second walls being formed as a corrugated sheet wherein corrugations form, along an inner surface thereof and an outer surface opposite the inner surface, lands and grooves alternating across the width direction; and
wherein the grooves on the inner surface carry a condensate of the working fluid along the inner surface.

9. The apparatus of claim 8, wherein the second portion of the mesh constitutes a spacer spacing apart the first and second walls by supporting compressive forces.

10. The apparatus of claim 9, wherein:
the spacer is corrugated to form channels larger in cross sectional area than a cross-sectional area corresponding to the grooves on the interior surface.

11. The apparatus of claim 10, further comprising:
a filler increasing thermal conductivity between the grooves on the interior surface by filling the grooves on the exterior surface.

* * * * *